United States Patent
Sato

(10) Patent No.: US 8,441,884 B2
(45) Date of Patent: May 14, 2013

(54) SEMICONDUCTOR MEMORY DEVICE, IMAGE PROCESSING SYSTEM, AND IMAGE PROCESSING METHOD

(75) Inventor: Takahiko Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 937 days.

(21) Appl. No.: 12/407,311

(22) Filed: Mar. 19, 2009

(65) Prior Publication Data

US 2009/0244077 A1 Oct. 1, 2009

(30) Foreign Application Priority Data

Mar. 27, 2008 (JP) ................................. 2008-084088

(51) Int. Cl.
*G11C 8/00* (2006.01)
(52) U.S. Cl.
USPC .................... 365/230.06; 365/238.5; 345/214
(58) Field of Classification Search ............ 365/230.06, 365/238.5; 345/98, 214
See application file for complete search history.

(56) References Cited

U.S. PATENT DOCUMENTS

| | | | | |
|---|---|---|---|---|
| 6,108,265 A | * | 8/2000 | Takeuchi | 365/230.03 |
| 6,115,323 A | | 9/2000 | Hashimoto | |
| 6,141,291 A | * | 10/2000 | Kohno | 365/230.06 |
| 6,181,632 B1 | | 1/2001 | Kondo et al. | |
| 6,856,308 B2 | * | 2/2005 | Akimoto et al. | 345/98 |
| 7,084,866 B2 | * | 8/2006 | Kobayashi | 345/214 |
| 7,110,301 B2 | * | 9/2006 | Lee et al. | 365/185.29 |
| 7,349,286 B2 | * | 3/2008 | Poechmueller | 365/230.06 |
| 2001/0038567 A1 | | 11/2001 | Ishikawa | |
| 2002/0114205 A1 | | 8/2002 | Tsuruda et al. | |
| 2004/0095835 A1 | | 5/2004 | La et al. | |

FOREIGN PATENT DOCUMENTS

| | | |
|---|---|---|
| JP | 11-144451 A | 5/1999 |
| JP | 11144451 | 5/1999 |
| JP | 2000-90256 A | 3/2000 |
| JP | 2001-312885 A | 11/2001 |
| JP | 2001 1312885 | 11/2001 |
| JP | 2002-245780 | 8/2002 |
| JP | 2004 171753 | 6/2004 |
| JP | 2004-171753 A | 6/2004 |
| JP | 2007-128233 A | 5/2007 |

OTHER PUBLICATIONS

Japanese Office Action dated Aug. 7, 2012, 8 pages.
Japanese Office Action issued Jul. 3, 3012; Notification of Reason for Refusal, Patent Application No. 2008-084088.

* cited by examiner

*Primary Examiner* — Son Dinh
(74) *Attorney, Agent, or Firm* — Arent Fox LLP

(57) ABSTRACT

A semiconductor memory device comprises: a memory cell group, the memory cell including a number of which is 2n, the n being a positive integer; and a first decoder provided with respect to each of the memory cell groups and a second decoder. The first decoder activates a word line by the memory cell group based upon a first address and an n bit in a second address and the second decoder activates a bit line based upon the second address.

19 Claims, 28 Drawing Sheets

FIG. 12

| | CA7 CA6 CA5 CA4 | | | | | | | | | | | | | | | | | CA3 CA2 CA1 CA0 |
|---|---|---|---|---|---|---|---|---|---|---|---|---|---|---|---|---|---|---|
| | 0 0 0 0 | 0 0 0 1 | 0 0 1 0 | 0 0 1 1 | 0 1 0 0 | 0 1 0 1 | 0 1 1 0 | 0 1 1 1 | 1 0 0 0 | 1 0 0 1 | 1 0 1 0 | 1 0 1 1 | 1 1 0 0 | 1 1 0 1 | 1 1 1 0 | 1 1 1 1 | |
| 0 0 0 0 | 00 | 10 | 20 | 30 | 40 | 50 | 60 | 70 | 80 | 90 | A0 | B0 | C0 | D0 | E0 | F0 | |
| 0 0 0 1 | 01 | 11 | 21 | 31 | 41 | 51 | 61 | 71 | 81 | 91 | A1 | B1 | C1 | D1 | E1 | F1 | |
| 0 0 1 0 | 02 | 12 | 22 | 32 | 42 | 52 | 62 | 72 | 82 | 92 | A2 | B2 | C2 | D2 | E2 | F2 | |
| 0 0 1 1 | 03 | 13 | 23 | 33 a | 43 | 53 | 63 | 73 | 83 | 93 | A3 | B3 c | C3 | D3 | E3 | F3 | |
| 0 1 0 0 | 04 | 14 | 24 | 34 | 44 | 54 | 64 | 74 | 84 | 94 | A4 | B4 | C4 | D4 | E4 | F4 | |
| 0 1 0 1 | 05 | 15 | 25 | 35 | 45 | 55 | 65 | 75 | 85 | 95 | A5 | B5 | C5 | D5 | E5 | F5 | |
| 0 1 1 0 | 06 | 16 | 26 | 36 | 46 | 56 | 66 | 76 | 86 | 96 | A6 | B6 | C6 | D6 | E6 | F6 | |
| 0 1 1 1 | 07 | 17 | 27 | 37 | 47 | 57 | 67 | 77 | 87 | 97 | A7 | B7 | C7 | D7 | E7 | F7 | |
| 1 0 0 0 | 08 | 18 | 28 | 38 | 48 | 58 | 68 | 78 | 88 | 98 | A8 | B8 | C8 | D8 | E8 | F8 | |
| 1 0 0 1 | 09 | 19 | 29 | 39 | 49 | 59 | 69 | 79 | 89 | 99 | A9 | B9 | C9 | D9 | E9 | F9 | |
| 1 0 1 0 | 0A | 1A | 2A | 3A | 4A | 5A | 6A | 7A | 8A | 9A | AA | BA | CA | DA | EA | FA | |
| 1 0 1 1 | 0B | 1B | 2B | 3B b | 4B | 5B | 6B | 7B | 8B | 9B | AB | BB d | CB | DB | EB | FB | |
| 1 1 0 0 | 0C | 1C | 2C | 3C | 4C | 5C | 6C | 7C | 8C | 9C | AC | BC | CC | DC | EC | FC | |
| 1 1 0 1 | 0D | 1D | 2D | 3D | 4D | 5D | 6D | 7D | 8D | 9D | AD | BD | CD | DD | ED | FD | |
| 1 1 1 0 | 0E | 1E | 2E | 3E | 4E | 5E | 6E | 7E | 8E | 9E | AE | BE | CE | DE | EE | FE | |
| 1 1 1 1 | 0F | 1F | 2F | 3F | 4F | 5F | 6F | 7F | 8F | 9F | AF | BF | CF | DF | EF | FF | PAGE |

FIG. 13

| | CA=00 | | | CA=01 | | | CA=02 | | | CA=03 | | |
|---|---|---|---|---|---|---|---|---|---|---|---|---|
| DQ0 | DQ8 | DQ16 | DQ24 | DQ0 | DQ8 | DQ16 | DQ24 | DQ0 | DQ8 | DQ16 | DQ24 | |
| DQ1 | DQ9 | DQ17 | DQ25 | DQ1 | DQ9 | DQ17 | DQ25 | DQ1 | DQ9 | DQ17 | DQ25 | |
| DQ2 | DQ10 | DQ18 | DQ26 | DQ2 | DQ10 | DQ18 | DQ26 | DQ2 | DQ10 | DQ18 | DQ26 | |
| DQ3 | DQ11 | DQ19 | DQ27 | DQ3 | DQ11 | DQ19 | DQ27 | DQ3 | DQ11 | DQ19 | DQ27 | |
| DQ4 | DQ12 | DQ20 | DQ28 | DQ4 | DQ12 | DQ20 | DQ28 | DQ4 | DQ12 | DQ20 | DQ28 | |
| DQ5 | DQ13 | DQ21 | DQ29 | DQ5 | DQ13 | DQ21 | DQ29 | DQ5 | DQ13 | DQ21 | DQ29 | |
| DQ6 | DQ14 | DQ22 | DQ30 | DQ6 | DQ14 | DQ22 | DQ30 | DQ6 | DQ14 | DQ22 | DQ30 | |
| DQ7 | DQ15 | DQ23 | DQ31 | DQ7 | DQ15 | DQ23 | DQ31 | DQ7 | DQ15 | DQ23 | DQ31 | |
| R | G | B | RSV | R | G | B | RSV | R | G | B | RSV | |

FIG. 15

| CA3 CA2 CA1 CA0 | 0 0 0 0 | 0 0 0 1 | 0 0 1 0 | 0 0 1 1 | 0 1 0 0 | 0 1 0 1 | 0 1 1 0 | 0 1 1 1 | 1 0 0 0 | 1 0 0 1 | 1 0 1 0 | 1 0 1 1 | 1 1 0 0 | 1 1 0 1 | 1 1 1 0 | 1 1 1 1 |
|---|---|---|---|---|---|---|---|---|---|---|---|---|---|---|---|---|
| | 00 | 01 | 02 | 03 | 04 | 05 | 06 | 07 | 08 | 09 | 0A | 0B | 0C | 0D | 0E | 0F |
| | 10 | 11 | 12 | 13 | 14 | 15 | 16 | 17 | 18 | 19 | 1A | 1B | 1C | 1D | 1E | 1F |
| | 20 | 21 | 22 | 23 | 24 | 25 | 26 | 27 | 28 | 29 | 2A | 2B | 2C | 2D | 2E | 2F |
| | 30 | 31 | 32 | 33 | 34 | 35 | 36 | 37 | 38 | 39 | 3A | 3B | 3C | 3D | 3E | 3F |
| | 40 | 41 | 42 | 43 | 44(a) | 45 | 46 | 47 | 48 | 49 | 4A | 4B(b) | 4C | 4D | 4E | 4F |
| | 50 | 51 | 52 | 53 | 54 | 55 | 56 | 57 | 58 | 59 | 5A | 5B | 5C | 5D | 5E | 5F |
| | 60 | 61 | 62 | 63 | 64 | 65 | 66 | 67 | 68 | 69 | 6A | 6B | 6C | 6D | 6E | 6F |
| | 70 | 71 | 72 | 73 | 74 | 75 | 76 | 77 | 78 | 79 | 7A | 7B | 7C | 7D | 7E | 7F |
| | 80 | 81 | 82 | 83 | 84 | 85 | 86 | 87 | 88 | 89 | 8A | 8B | 8C | 8D | 8E | 8F |
| | 90 | 91 | 92 | 93 | 94 | 95 | 96 | 97 | 98 | 99 | 9A | 9B | 9C | 9D | 9E | 9F |
| | A0 | A1 | A2 | A3 | A4 | A5 | A6 | A7 | A8 | A9 | AA | AB | AC | AD | AE | AF |
| | B0 | B1 | B2 | B3 | B4 | B5 | B6 | B7 | B8 | B9 | BA | BB | BC | BD | BE | BF |
| | C0 | C1 | C2 | C3(c) | C4 | C5 | C6 | C7 | C8 | C9 | CA | CB(d) | CC | CD | CE | CF |
| | D0 | D1 | D2 | D3 | D4 | D5 | D6 | D7 | D8 | D9 | DA | DB | DC | DD | DE | DF |
| | E0 | E1 | E2 | E3 | E4 | E5 | E6 | E7 | E8 | E9 | EA | EB | EC | ED | EE | EF |
| | F0 | F1 | F2 | F3 | F4 | F5 | F6 | F7 | F8 | F9 | FA | FB | FC | FD | FE | FF |

CMODE=L CA7=L

CA7 CA6 CA5 CA4: 0 0 0 0 / 0 0 0 1 / 0 0 1 0 / 0 0 1 1 / 0 1 0 0 / 0 1 0 1 / 0 1 1 0 / 0 1 1 1 / 1 0 0 0 / 1 0 0 1 / 1 0 1 0 / 1 0 1 1 / 1 1 0 0 / 1 1 0 1 / 1 1 1 0 / 1 1 1 1

PAGE

| CA3 CA2 CA1 CA0 | | | | | | | | | | | | | | | | | PAGE |
|---|---|---|---|---|---|---|---|---|---|---|---|---|---|---|---|---|---|
| | 0 | 1 | 0 | 1 | 0 | 1 | 0 | 1 | 0 | 1 | 0 | 1 | 0 | 1 | 0 | 1 | |
| | 0 | 0 | 1 | 1 | 0 | 0 | 1 | 1 | 0 | 0 | 1 | 1 | 0 | 0 | 1 | 1 | |
| | 0 | 0 | 0 | 0 | 1 | 1 | 1 | 1 | 0 | 0 | 0 | 0 | 1 | 1 | 1 | 1 | |
| | 0 | 0 | 0 | 0 | 0 | 0 | 0 | 0 | 1 | 1 | 1 | 1 | 1 | 1 | 1 | 1 | |
| 00 | 01 | 02 | 03 | 04 | 05 | 06 | 07 | 08 | 09 | 0A | 0B | 0C | 0D | 0E | 0F |
| 10 | 11 | 12 | 13 | 14 | 15 | 16 | 17 | 18 | 19 | 1A | 1B | 1C | 1D | 1E | 1F |
| 20 | 21 | 22 | 23 | 24 | 25 | 26 | 27 | 28 | 29 | 2A | 2B | 2C | 2D | 2E | 2F |
| 30 | 31 (a) | 32 | 33 | 34 | 35 (b) | 36 | 37 | 38 | 39 | 3A | 3B | 3C | 3D (c) | 3E | 3F |
| 40 | 41 | 42 | 43 | 44 | 45 | 46 | 47 | 48 | 49 | 4A | 4B | 4C | 4D | 4E | 4F |
| 50 | 51 | 52 | 53 | 54 | 55 | 56 | 57 | 58 | 59 | 5A | 5B | 5C | 5D | 5E | 5F |
| 60 | 61 | 62 | 63 | 64 | 65 | 66 | 67 | 68 | 69 | 6A | 6B | 6C | 6D | 6E | 6F |
| 70 | 71 | 72 | 73 | 74 | 75 | 76 | 77 | 78 | 79 | 7A | 7B | 7C | 7D | 7E | 7F |
| 80 | 81 | 82 | 83 | 84 | 85 | 86 | 87 | 88 | 89 | 8A | 8B | 8C | 8D | 8E | 8F |
| 90 | 91 | 92 | 93 | 94 | 95 | 96 | 97 | 98 | 99 | 9A | 9B | 9C | 9D | 9E | 9F |
| A0 | A1 | A2 | A3 | A4 | A5 | A6 | A7 | A8 | A9 | AA | AB | AC | AD | AE | AF |
| B0 | B1 (e) | B2 | B3 | B4 | B5 (f) | B6 | B7 | B8 | B9 (g) | BA | BB | BC | BD (h) | BE | BF |
| C0 | C1 | C2 | C3 | C4 | C5 | C6 | C7 | C8 | C9 | CA | CB | CC | CD | CE | CF |
| D0 | D1 | D2 | D3 | D4 | D5 | D6 | D7 | D8 | D9 | DA | DB | DC | DD | DE | DF |
| E0 | E1 | E2 | E3 | E4 | E5 | E6 | E7 | E8 | E9 | EA | EB | EC | ED | EE | EF |
| F0 | F1 | F2 | F3 | F4 | F5 | F6 | F7 | F8 | F9 | FA | FB | FC | FD | FE | FF |

SEMICONDUCTOR MEMORY DEVICE, IMAGE PROCESSING SYSTEM, AND IMAGE PROCESSING METHOD

CROSS-REFERENCE TO RELATED APPLICATIONS

This application claims the benefit of priority from Japanese Patent Application No. 2008-84088 filed on Mar. 27, 2008, the entire contents of which are incorporated herein by reference.

BACKGROUND

1. Field

This application relates to a semiconductor memory device that includes a plurality of memory blocks.

2. Description of Related Art

The order of reading or writing image data held in a semiconductor memory device differs depending on the intended purposes of the image data. For example, during horizontal access of image data, the image data is sequentially read in response to display lines of an image plane. For example, during rectangular access, in image processing, such as encoding, the image data is read in a rectangularly shaped manner across a plurality of the display lines.

Japanese Laid-open Patent Publication No. 2007-128233 and Japanese Laid-open Patent Publication No. 2000-90256 discuss an image data reading operation from a plurality of memory blocks and an image data writing operation to the plurality of memory blocks or the like.

SUMMARY

According to aspects of an embodiment, a semiconductor memory device comprises: a memory cell group, the memory cell group including a number of which is 2n, the n being a positive integer; and a first decoder provided with respect to each of the memory cell groups and a second decoder, wherein the first decoder activates a word line by the memory cell group based upon a first address and an n bit in a second address, wherein the second decoder activates a bit line based upon the second address.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 12 illustrates an exemplary address map in a page;
FIG. 13 illustrates an exemplary relationship between pixels in the page and column addresses;
FIG. 15 illustrates an exemplary horizontal access;
FIG. 16 illustrates an exemplary vertical access;
FIG. 23 illustrates an exemplary address map in a page.

DESCRIPTION OF EMBODIMENTS

In the Figs, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol suffixed with a letter "Z" indicates a positive logic. A signal having a reference symbol prefixed with a symbol "/" and a signal having a reference symbol suffixed with a letter "X" indicate a negative logic. A double-square symbol represents an external terminal such as a pad on a semiconductor chip or a lead of a package containing the semiconductor chip therein. Terminals and signals supplied through the terminals, respectively, are denoted by like reference symbols.

Figure 1:
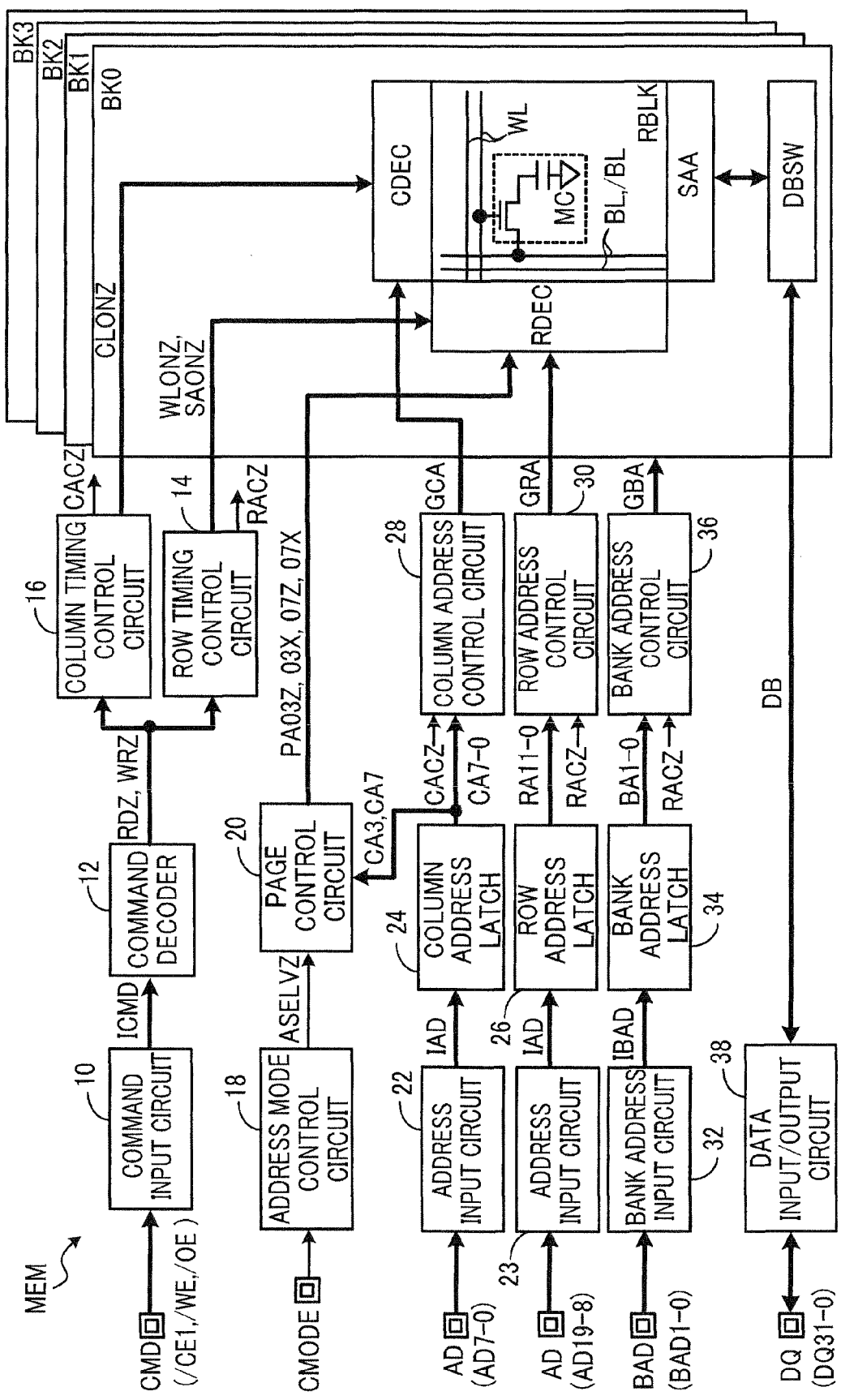
FIG. 1 illustrates a first embodiment.

FIG. 1 illustrates a first embodiment. In one aspect, a semiconductor memory MEM maybe a pseudo-SRAM type Fast Cycle RAM (FCRAM) asynchronous type. Note, however, that the memory MEM may be a clock synchronous type.

As depicted in FIG. 1, the memory MEM includes a command input circuit 10, a command decoder 12, a row timing control circuit 14, a column timing control circuit 16, an address mode control circuit 18, a page control circuit 20, address input circuits 22 and 23, a column address latch 24, a row address latch 26, a column address control circuit 28, a row address latch circuit 30, a bank address input circuit 32, a bank address latch 34, a bank address control circuit 36, a data input/output circuit 38, and banks BK0 to BK3.

The command input circuit 10 receives a command signal CMD and outputs the received command signal CMD as an internal command signal ICMD. The command signal CMD may includes, for example, a chip enable signal /CE1, a write enable signal /WE, an output enable signal /OE.

The command decoder 12 decodes the internal command signal ICMD and outputs a read command signal RDZ or a write command signal WRZ so as to access the banks BK0 to BK3, such as, for read/write operations.

The row timing control circuit 14 activates a word control signal WLONZ and a sense amplifier control signal SAONZ so as to activate each of the banks BK0 to BK3 in response to activation of the read command signal RDZ and the write command signal WRZ. Further, the row timing control circuit 14 deactivates the word control signal WLONZ and the sense amplifier control signal SAONZ so as to deactivate each of the banks BK0 to BK3 in response to deactivation of the read command signal RDZ and the write command signal WRZ. The word control signal WLONZ is a timing signal to activate a word line WL, The sense amplifier control signal SAONZ is a timing signal to activate a sense amplifier SA. The row timing control circuit 14 outputs a row address control signal RACZ, which sets timing of supplying a global row address signal GRA and a global bank address signal GBA to the banks BK0 to BK3 in response to the activation of the read command signal RDZ and the write command signal WRZ.

Figure 5:
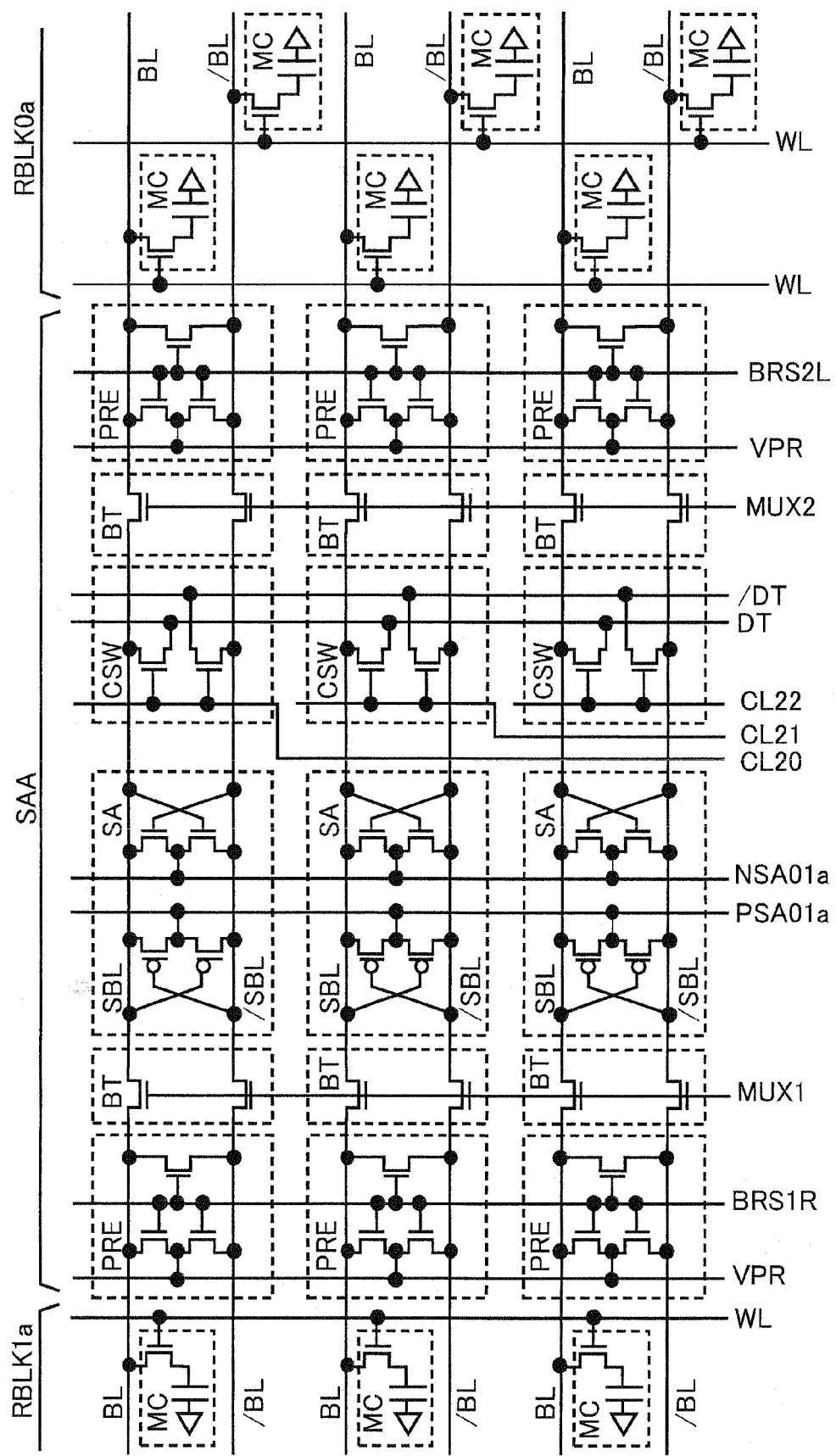
FIG. 5 illustrates an exemplary sense amplifier area.

The row timing control circuit 14 outputs a timing signal not illustrated) for generating a pre-charge control signal that pre-charges bit lines EL and /BL and a timing signal for generating a bit control signal that controls a coupling switch ET, such as the coupling switch illustrated in FIG. 5. The row timing control circuit 14 includes a refresh request generation circuit, which periodically generates an internal refresh command so as to execute a refresh operation an arbiter, which determines priority between an access operation and the refreshing operation when a competition may occur between an external access command, such as, the read command signal RDZ or the write command signal WRZ, and the internal refresh command.

The column timing control circuit 16 activates a column control signal CLONZ to output read data from each of the banks BK0 to BK3, in response to the read command signal RDZ. The column timing control circuit 16 activates the column control signal CLONZ to input write data to each of the banks BK0 to BK3, in response to the write command signal WRZ. The column control signal CLONZ is a timing signal for turning on a column switch CSW, such as the column switch CSW illustrated in FIG. 5. The column timing control circuit 16 prohibits outputting the column control signal CLONZ when the refreshing operation is executed under control of the row timing control circuit 14. The column timing control circuit 16 outputs a column address control signal CACZ, which sets timing for supplying a global column address signal GCA to each of the banks BK0 to BK3 in response to the activation of the read command signal RDZ and the write command signal WRZ.

The address mode control circuit 18 outputs an access mode signal CMODE supplied via an external terminal as a rectangular area selection signal ASELVZ. The access mode signal CMODE is input to the address mode control circuit 18. In one aspect, a logic level of the rectangular area selection signal ASELVZ is the same as a logic level of the access mode signal CMODE. A memory controller MCNT, such as the memory controller illustrated in FIG. 2, outputs a low level access mode signal CMODE when a laterally long area or a horizontally long area on the display is accessed. The memory controller MCNT outputs a high level access mode control signal CMODE when the longitudinally long area or a rectangular area on the display is accessed.

The page control circuit 20 receives the rectangular area selection signal ASELVZ and 2-bit column address signals CA3 and CA7 and outputs page activation signals PA03Z, PA03X, PA07Z, and PA07X, as a control signal. The page activation signals PA03Z, PA03X, PA07Z, and PA07X are supplied to a row decoder RDEC to selectively activate the word line WL.

The address input circuit 22 outputs address signals AD (AD7 to AD0) supplied via an external terminal, as internal address signals IAD (IAD 7 to IAD0). The address input circuit 23 outputs address signals AD (AD19 to AD8) supplied via an external terminal, as internal address signals IAD (IAD19 to IAD8). The address input circuits 22 and 23 contemporaneously receive the address signals AD7 to AD0 and the address signals AD19 to AD8 by use of the different terminals. In one aspect, the address signals AD7 to AD0 are column address signals to select a pair of the bit lines EL and /BL and the address signals AD19 to AD8 are row address signals to select the word line WL.

The column address latch 24 latches the internal address signals IAD from the address input circuit 22 to output as column address signals CA7 to CA0. The row address latch 26 latches the internal address signals IAD from the address input circuit 23 to output as row address signals RA11 to RA0.

The column address control circuit 28 latches the column address signals CA7 to CA0 in synchronization with the column address control signal CACZ to output as the global column address signals GCA (GCA7 to GCA0). The row address control circuit 30 latches the row address signals RA11 to RA0 in synchronization with the row address control signal RACE to output as the global row address signals GRA (GRA11 to GRA0). The row address control circuit 30 includes a refresh address counter that generates a refresh address signal and an address selector that selects the refresh address signal and one of the row address signals RA11 to RA0. The refresh address signal indicates a word line WL coupled to a memory cell MC to be refreshed. An address signal selected by the address selector is output as the global row address signal GRA.

The bank address input circuit 32 outputs bank address signals BAD (BAD1 and BAD0), supplied via an external terminal, as internal bank address signals IBAD (IBAD1 and IBAD0). The bank address signals BAD1 and BAD0 are supplied to select the bank BK0 to BK3. The bank address latch 34 latches the internal bank address signals IBAD to output as bank address signals BA]. and BA0. The bank address control circuit 36 latches the bank address signals BA1 and BA0 in synchronization with the row address control signal RACZ to output the global bank address signals GRA (GBA1 and GBA0).

The data input/output circuit 38 receives read data read out from the memory cell MC during the read operation via a complementary data bus DB and outputs the received read data to data terminals DQ (DQ31 to DQ0). In one aspect, the data input/output circuit 38 receives a write data signal supplied to the data terminals DQ during the write operation to output the received data signal to the data bus DE.

Structures of the banks BK0 to BK3 are the same as or similar to one another. Each of the banks BK0 to BK3 includes a plurality of memory blocks RBLK, a row decoder RDEC, a column decoder CDEC, a sense amplifier area SAA, and a data bus switch DBSW. Each memory block RBLK includes a plurality of dynamic memory cells MC arranged in a matrix form, a plurality of the word lines WL coupled to a row of the memory cells MC arranged in a lateral direction, and a plurality of pairs of bit lines BL and /BL coupled to a column of the memory cells MC arranged in a longitudinal direction. The memory cell MC includes a capacitor to hold data as an electrical charge and a transfer transistor to couple one end of the capacitor to the bit line BL or the bit line /BL. The other end of the capacitor is coupled to a reference voltage line.

The column address decoder CDEC decodes the global column address signal GCA to select the number of pairs of bit lines BL and /BL, corresponding to the number of bits of the data terminal DQ. The data bus switch DBSW outputs complementary read data, output from the sense amplifier area SAA, to the data bus DB, during the read operation. The data bus switch DBSW outputs complementary write data, supplied via the data bus DB, to the sense amplifier area SAA, during the write operation.

Figure 2:
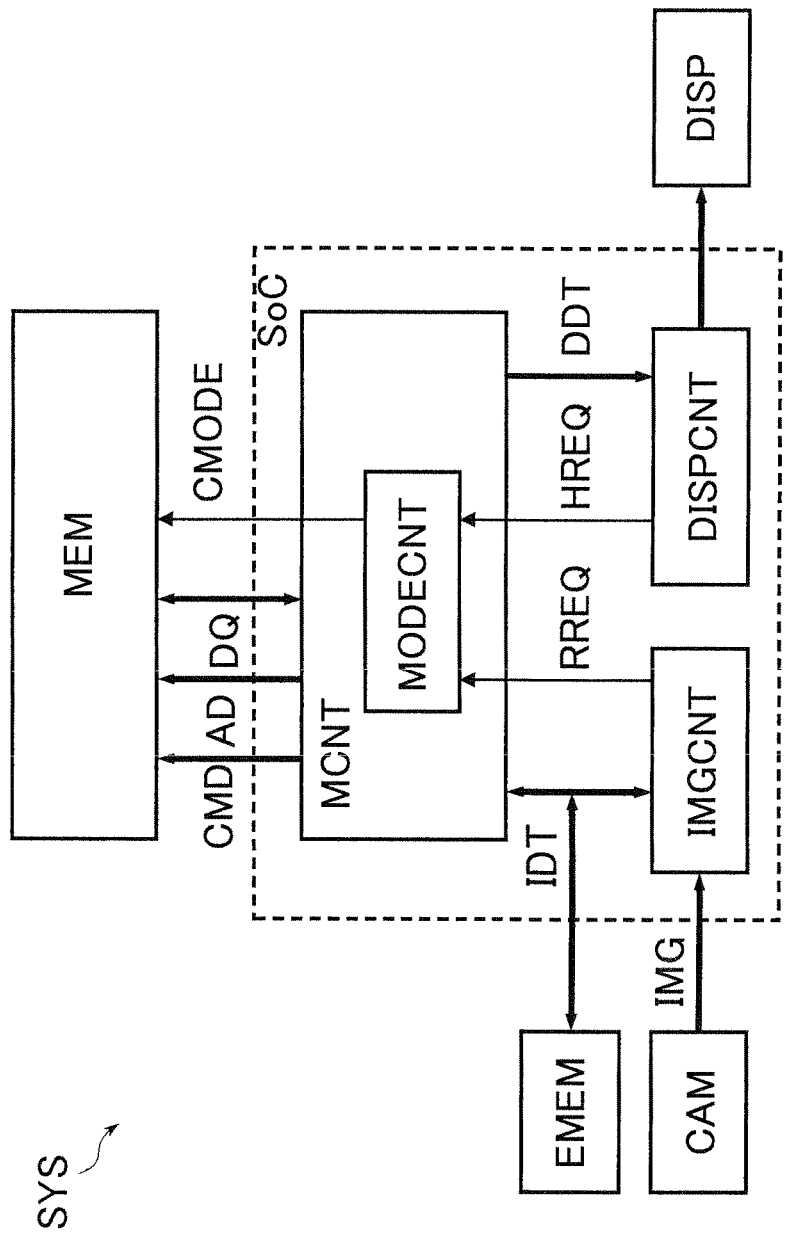
FIG. 2 illustrates an exemplary system including a memory.

FIG. 2 illustrates an exemplary system including the memory MEM illustrated in FIG. 1. The system illustrated in FIG. 1 may be, for example, an image processing system. A system SYS may include at least a part of an apparatus, for example, a digital camera or a personal computer. Embodiments hereinafter disclosed may be provided on the system SYS, such as the system illustrated in FIG. 2.

The system SYS includes the memory MEM, the memory controller MCNT, an image data control unit IMGCNT, a display data control unit DISPCNT, an external memory EMEM, a camera CAM, such as a CCD, and a display device DISP, such as a liquid crystal display device. For example, the memory controller MCNT, the image data control unit IMGCNT, and the display data control unit DISPCNT may be designed as a System on Chip (SoC) where a plurality of macros are integrated on a silicon substrate. For example, the memory chip MEM, the System on Chip SoC, and the external memory EMEM may be designed in a manner that they are stacked to one another to form a multi-chip package MCP. For example, the multi-chip package MCP, the camera CAM, and the display device DISP may be provided on a printed substrate. The image processing system includes at least the memory MEM, the memory controller MCNT, the image data control unit IMGCNT, and the display data control unit DISPCNT.

The image data control unit IMGCNT controls encoding and decoding of image data. The image data control unit IMGCNT encodes, for example, image data IMG from the camera CAM or image data transferred from the memory controller MCNT via an internal data line IDT and writes the encoded data to the external memory EMEM. In one aspect, the image data may be written to the external memory EMEM after compressing. The external memory EMEM may be, for example, an SRAM or a DRAM.

The image data control unit IMGCNT reads the encoded data, held in the external memory EMEM, via the internal data line IDT and decodes the read data. This decoding may be accompanied by image data extension. The image data control unit IMGCNT may control one of the image data encoding or the image data decoding. For example, if the external memory EMEM may be a non-volatile recording medium, such as a DVD-ROM, the image data control unit IMGCNT decodes the data read from the external memory EMEM.

The image data control unit IMGCNT outputs a rectangular access request RREQ to the memory controller MCNT along with information, which indicates an access area, the data reading, and the number of pieces of transferred data, when the image data to be encoded is read from the memory MEM. The image data control unit IMGCNT outputs the rectangular access request RREQ to the memory controller MCNT along with information, which indicates the access area, the data writing, and the number of pieces of transferred data when the decoded image data is written to the memory MEM. The image data control unit IMGCNT may output a normal access request to the memory controller MCNT to read or to write all of the data in a page PAGE.

The display data control unit DISPCNT controls displaying the image data on the display device DISP. For example, the image data control unit DISPCNT outputs a horizontal access request HREQ to the memory controller MCNT along with information, which indicates the access area, the data reading, and the number of pieces of the transferred data. The display data control unit DISPCNT outputs the image data, transferred from the memory controller MCNT via a display data line DDT, to the display device DISP. The display device DISP displays the image data from the display data control unit DISPCNT. The display data control unit DISPCNT may output the normal access request to the memory controller MCNT.

The memory controller MCNT includes a mode control unit MODECNT. When receiving the horizontal access request HREQ, the mode control unit MODECNT sets the access mode signal CMODE to the low level and outputs the command signal CMD and the address signal AD to the memory MEM. When receiving the rectangular access request RREQ, the mode control unit MODECNT sets the access mode signal CMODE to the high level and outputs the command signal CMD and the address signal AD to the memory MEM. During the write operation, the data signal DQ is output to the memory MEM.

The memory MEM operates in a first word line access mode when the access mode signal CMODE is the low level. The memory MEM operates in a second word line access mode when the access mode signal CMODE is the high level. In response to the horizontal access request HREQ from the display data control unit DISPCNT, the memory MEM operates in the first word line access mode and reads the image data from the memory block RBLK In response to the rectangular access request RREQ from the image data control unit IMGCNT, the memory MEM operates in the second word line access mode and reads the image data from the memory block RBLK.

An image is displayed on the display unit DISP by the image data control unit IMGCNT in the first word line access mode. The image data is encoded or decoded by the image data control unit IMGCNT in the second word line access mode. The access mode signal CMODE specifies image processing of image data held in the memory block RBLK. The first word line access mode and the second word line access mode relate to the image processing of the image data held in the memory block RBLK. The word lines WL are activated by an adjacent division unit, in the first word line access mode. The word lines WL are activated by a non-adjacent division unit, in the second word line access mode.

Figure 3:
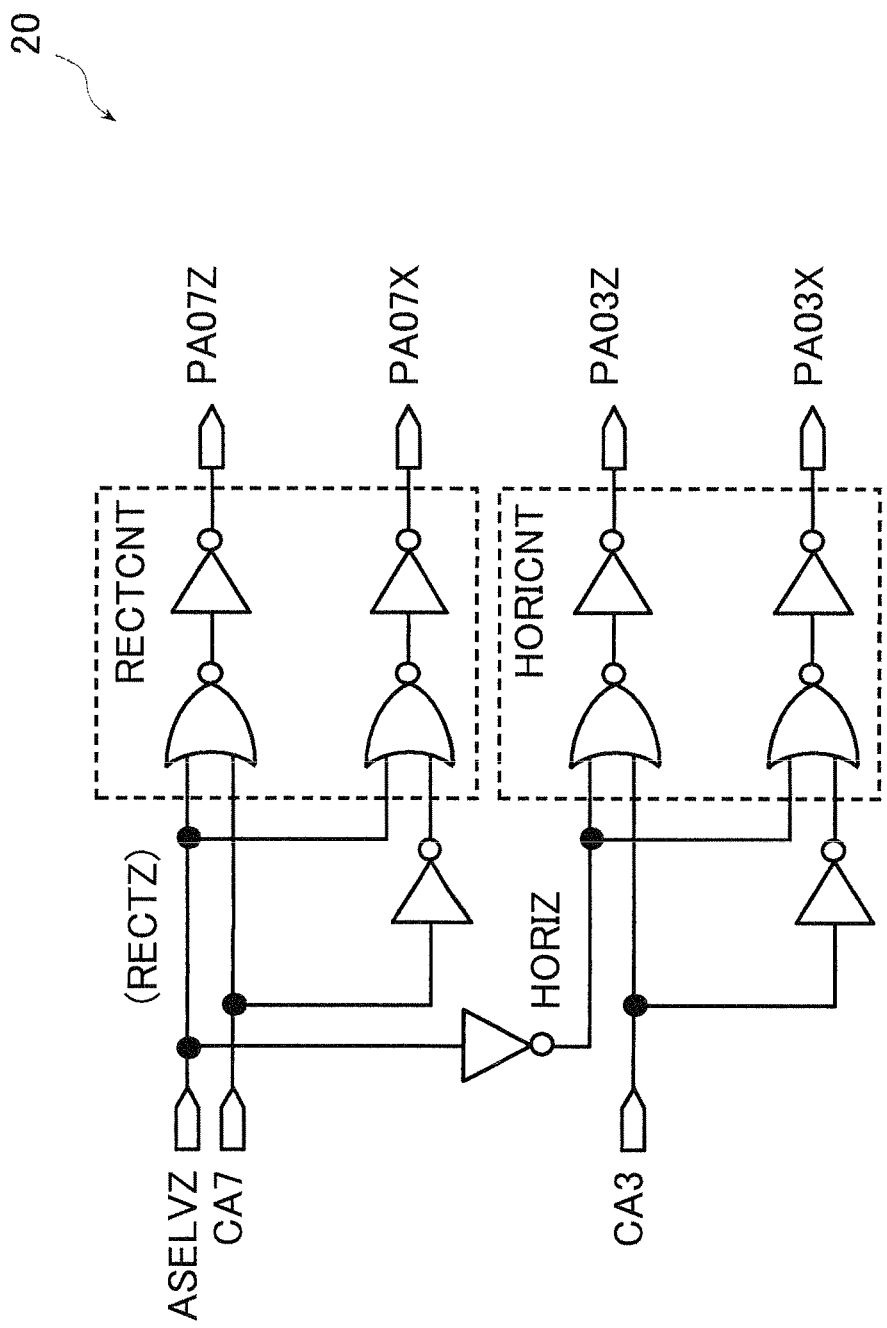
FIG. 3 illustrates an exemplary page control circuit.

FIG. 3 illustrates an exemplary page control circuit 20, such as the page control circuit illustrated in FIG. 1. The page control circuit 20 includes a rectangular control circuit RECTCNT, which outputs the page activation signals PA07Z and PA07X, and a horizontal control circuit HORICNT, which outputs the page activation signals PA03Z and PA03X. The rectangular control circuit RECTCNT sets both of the page activation signals PA07Z and PA07X to a high level to execute rectangular access when the rectangular area selection signal ASELVZ is being activated to a high level. In one aspect, the rectangular control circuit RECTCNT sets logic levels of the page activation signals PA07Z and PA07X in response to a logic of the column address signal CA7 when the rectangular area selection signal ASELVZ is being deactivated to a low level.

The horizontal control circuit HORICNT sets both of the page activation signals PA03Z and PA03X to a high level to execute horizontal access when the rectangular area selection signal ASELVZ is being deactivated to the low level, for example when a horizontal signal HORIZ is at a high level. The horizontal control circuit HORICNT sets logic levels of the page activation signals PA03Z and PA03K in response to a logic of the column address signal CA3 when the rectangular area selection signal ASELVZ is being activated to the high level. The page control circuit 20 supplies the row decoder RDEC with the control signals PA03Z, PA03X, PA07Z, and PA07X for activating the word lines WL based upon the 2-bit column address signals CA3 and CA7.

Figure 4:
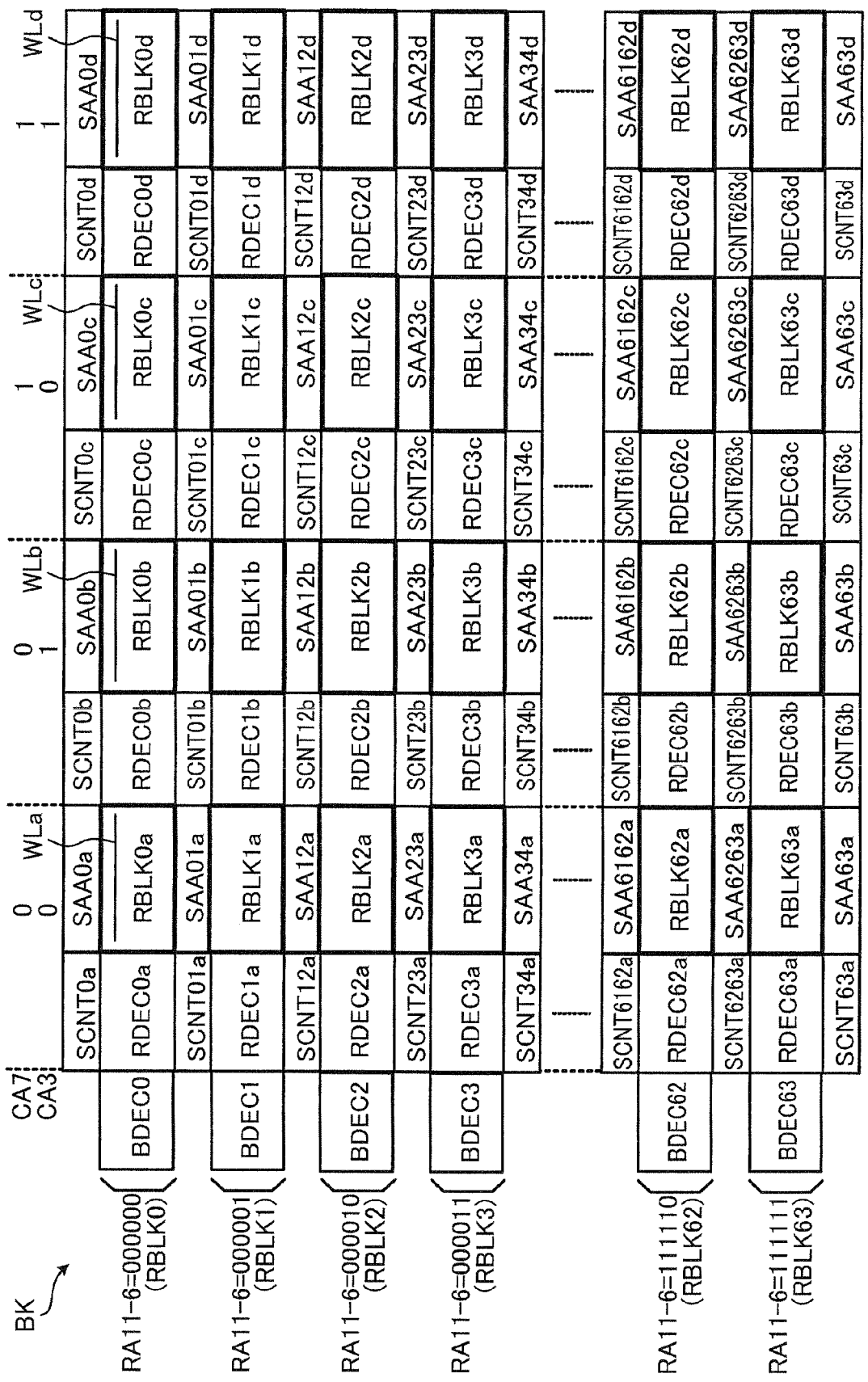
FIG. 4 illustrates an exemplary bank layout.

FIG. 4 illustrates an exemplary layout of the banks BK (BK0 to BK3), such as the banks BK illustrated in FIG. 1. Each bank BK includes 64 main-memory blocks RBLK (RBLK0 to RBLK63), which are identified with high-order row addresses RA11 to RA6. Each main-memory block RBLK includes sub-memory blocks RBLKa, RBLEb, RBLKc, and RBLKd, for example, RBLK0a, RBLK0b, RBLK0c, and RBLK0d, which are identified with the column address CA3 or CA7. The word line WL extending in a lateral direction in the main-memory blocks RBLK depicted in FIG. 4 is divided with respect to each sub-memory block, such as, RBLKa to RBLKd. The divided word lines WLa, WLb, WLc, and WLd are selected by the column address signal CA7 or CA3 and arranged according to the order of addresses.

Block decoders BDEC (BDEC0 to BDEC63) decode the row addresses RA11 to RA6 to select the main-memory blocks RBLK0 to RBLK63. For example, each block decoder BDEC may be arranged in the row decoder RDEC illustrated in FIG. 1. For example, the row decoders RDEC0a, RDEC0b, RDEC0c, and RDEC0d may be provided corresponding to each of the sub-memory blocks RBLKa to RBLKd.

Figure 6:
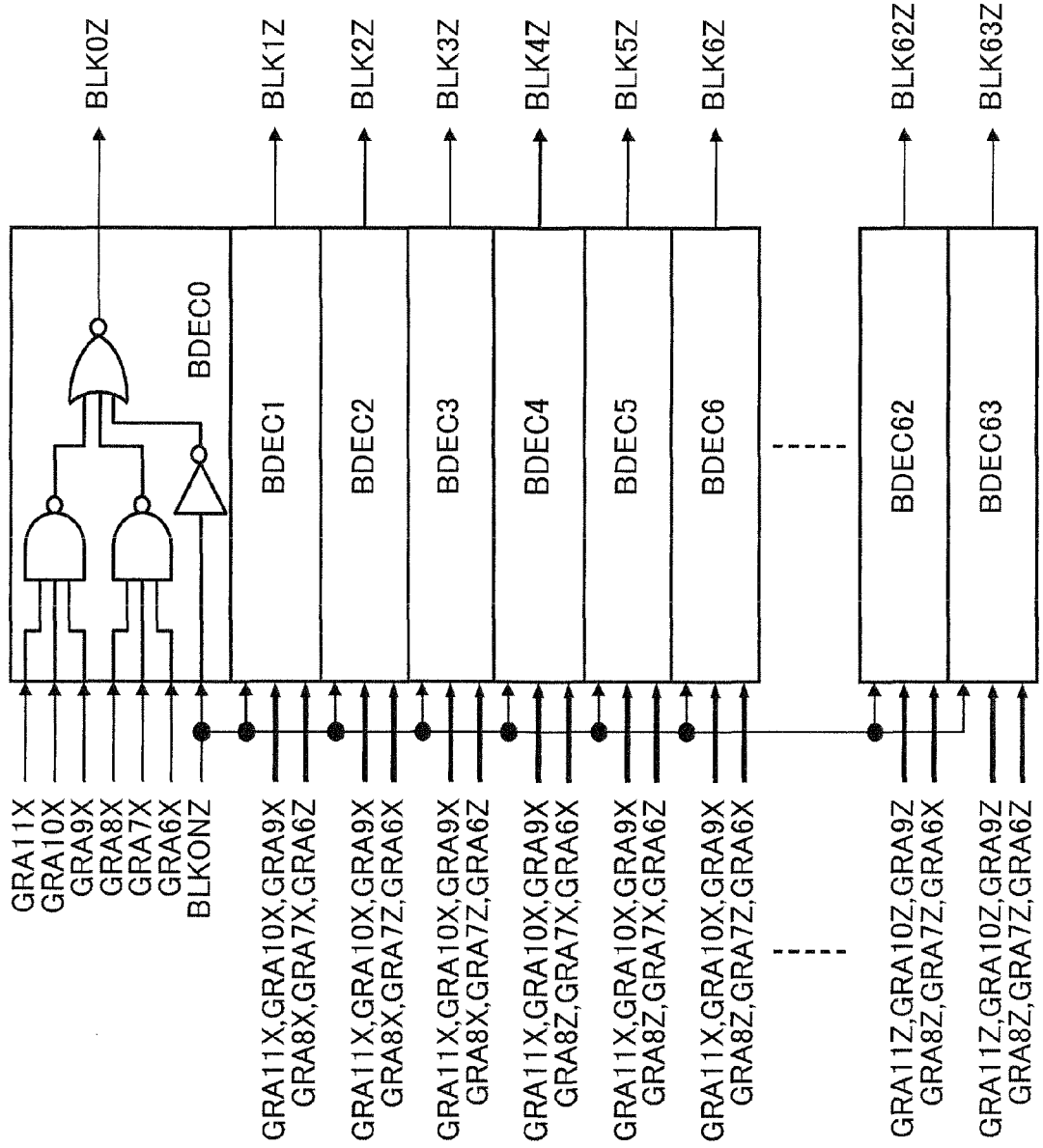
FIG. 6 illustrates an exemplary block decoder.

On both sides of each of the sub-memory blocks RBLKa to RBKLd, for example on an upper side and a lower side of an illustration in FIG. 6, the sense amplifier areas SAA, such as, SAA0a and SAA01a, are provided. A shared sense amplifier method is employed in the first embodiment. As such, the sense amplifier SA, which is provided between a pair of the memory blocks RBLK adjacent to one another, is shared with the pair of the memory blocks REM (in the shared sense amplifier method. Numerals attached to the sense amplifier areas SAP, represent numbers of the pair of memory blocks RBLK that share the sense amplifier area SAA.

Sense amplifier control circuits SCNT, such as, SCNT0a, SCNT0b, SCNT0c, and SCNT0d, are provided associated with each of the sense amplifier areas SAA, such as SAA0a, SAA0b, SAA0c, and SAA0d. Although it is not illustrated, the column decoder CDEC are provided with respect to each group of the sub-memory blocks RBLK, such as, RBLK0a, RBLK01a to RBLK63a, arranged in a longitudinal direction, such as depicted in FIG. 4. The column decoder CDEC may be provided with respect to each sub-memory block RBLK.

FIG. 5 illustrates an exemplary sense amplifier area SAA illustrated in FIGS. 1 and 4. FIG. 5 illustrates a state where the sense amplifier area SAA, such as the sense amplifier area SAA depicted in FIG. 4, is rotated by 90 degrees. For example, FIG. 5 illustrates an exemplary part of a sense amplifier area SAA that corresponds to one data terminal DQ.

A pre-charge control signal line BRS (BRS0 or BRS1), through which the pre-charge control signal is transmitted, are coupled to pre-charge circuits PRE of the sense amplifier area SAA. A bit control signal line MUX1 or MUX2, through which the bit control signal is transmitted, are coupled to the coupling switches BT of the sense amplifier areas SAA. The coupling switch BT includes an n-MOS transistor. The coupling switch ET controls coupling between the bit line BL or the bit line /BL and a bit line SLB or a bit line /SLB of the sense amplifier SA.

Sense amplifier activation signal lines PSA01a and NSA01a, through which a sense amplifier activation signal are transmitted, are coupled to the sense amplifier SA of the sense amplifier area SAA. The sense amplifier activation signal line PSA01a is activated to a low level in synchronization with the sense amplifier control signal SAONZ. The sense amplifier activation signal line NSA01a is activated to a high level in synchronization with the sense amplifier control signal SAONZ. Column selection signal lines CL20 to CL22 that transmit a column selection signal are coupled to the column switches CWS, respectively. The column selection signal is activated to a high level in synchronization with the column control signal CLONZ in response to the column address signals CA7 to CA0. A structure of the sense amplifier SAA may be the same as or similar to, for example, a structure of a sense amplifier area of the DRAM.

FIG. 6 illustrates an exemplary block decoders BDEC (BDEC0 to BDEC63), such as block decoders BDEC illustrated in FIG. 4. Since the block decoders BDEC0 to BDEC63 have the same logic to one another, the block decoder BDEC0 will be explained.

The block decoder BDEC0 activates a block selection signal BLK0Z in synchronization with a block control signal BLKONZ when pre-decode signals GRA11X to GRA6X are a high level. The pre-decode signals GRA11x to GRA6X are generated by pre-decoding the global row address signals GRA11 to GRA6, such as the global row address signals illustrated in FIG. 1. By way of example and not limitation, pre-decode signals GRA11X to GRA6X having a reference symbol suffixed with a letter "X" are signals whose logics are inverted from logics of the global row address signals GRA11 to GRA6. Pre-decode signals GRA11X to GRA6Z having a reference symbol suffixed with a letter "E" are signals whose logics are the same as the logics of the global row address signals GRA11 to GRA6. The block control signal BLKONZ is generated by delaying the row address control signal RACZ RACZ illustrated in FIG. 1, The block selection signal BLK0Z is used by the sub-memory blocks RBLK0a to RBLK0d RACZ illustrated in FIG. 4

Figure 7:
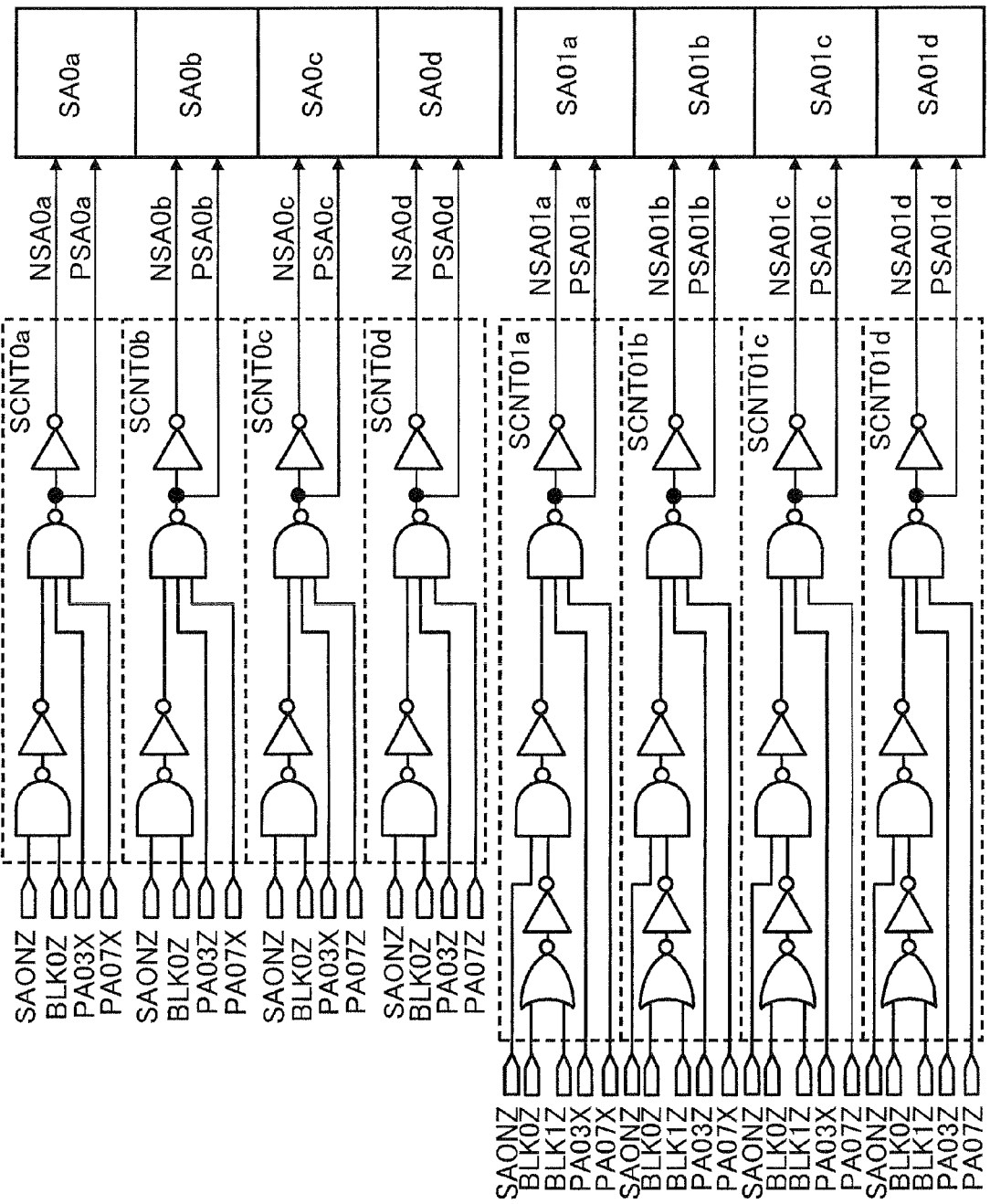
FIG. 7 illustrates an exemplary sense amplifier control circuit.

FIG. 7 illustrates an exemplary sense amplifier control circuit SCNT, such as the sense amplifier control circuit SCNT illustrated in FIG. 4. In one aspect, sense amplifier control circuits SCNT0a to SCNT0d have the same logic to one another and sense amplifier control circuits SCNT01a to SCNT01d have the same logic to one another. For this reason, only the sense amplifier control circuits SCNT0a and SCNT01a will be explained.

The sense amplifier control circuit SCNT0a outputs a sense amplifier activation signal NSA0a with a high level and a sense amplifier activation signal PSA0a with a low level, in synchronization with the sense amplifier control signal SAONZ and the block selection signal BLK0Z, if both of the page activation signals PA03X and PA07X are a high level. The sense amplifier activation signals NSAOa and PSA0a are supplied to a sense amplifier SAOa corresponding to the sub-memory block RBLK0a. Different combination among the page activation signals PA03Z, PA03X, PA07Z, and PA07X are supplied to the sense amplifier control circuits SCNT0a to SCNT0d, respectively.

The sense amplifier control circuit SCNT01a outputs the high-level sense amplifier activation signal NSA01a and the low-level sense amplifier activation signal PSA01a, in synchronization with the sense amplifier control signal SAONZ and the block selection signal ELK0Z or ELK1Z, if both of the page activation signals PA03X and PA07X are at the high level. The sense amplifier activation signals NSA01a and PSA01a are supplied to the sense amplifier SA01a corresponding to the sub-memory blocks RBLK0a and RBLK1a. Different combinations among the page activation signals PA03Z, PA03X, PA07Z, and PA07X are supplied to the sense amplifier control circuits SCNT01a to SCNT01d, respectively.

Figure 8:
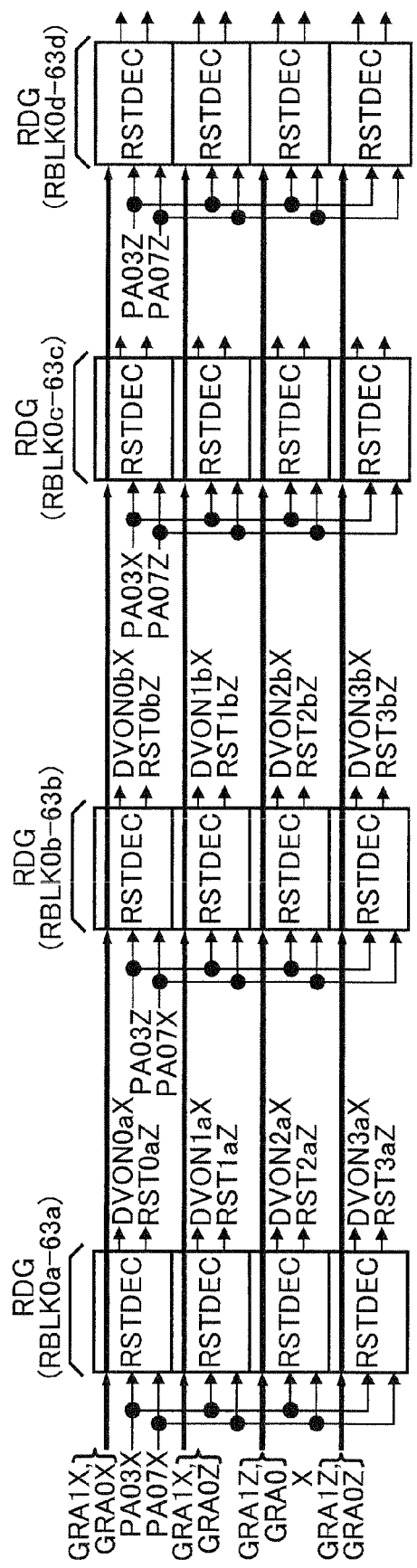
FIG. 8 illustrates an exemplary row decoder.

FIG. 8 illustrates an exemplary row decoder RDEC, such as the row decoder RDEC illustrated in FIG. 4. The row decoder RDEC may include, for example, 16 reset decoders RSTDEC. In one aspect, the respective reset decoders RSTDEC are the same or similar circuits to one another. Four (4)

reset decoder groups RDG, each of which further includes four (4) reset decoders RSTDEC arranged in a longitudinal direction in FIG. 8, access the sub-memory blocks RBLKa to RBLKd, respectively.

A reset decoder group RDG, which outputs word-reset signals RST0aZ to RST3aZ, may be provided, for example, in the row decoder RDEC0a illustrated in FIG. 4. The reset decoder group RDG is used by the sub-memory blocks RBLK0a to RBLK63a in a shared manner. A reset decoder group RDG which outputs word reset signals RST0bZ to RST3bZ, a reset decoder group RDG which outputs word reset signals RST0cZ to RST3c2, and a reset decoder group RDG which outputs word reset signals RST0dZ to RST3dZ are provided in the row decoder RDEC0b, the row decoder RDEC0c, and the row decoder RDEC0d, respectively. Three (3) reset decoder groups RDG are used, in a shared manner, by the sub-memory blocks RBLK0b to RBLK63b, the sub-memory blocks RBLK0c to RBLK63c, and the sub-memory blocks RBLK0d to RBLK63d, such as illustrated in FIG. 4, respectively.

Names of output signals output from the reset decoder groups RDG corresponding to the sub-memory blocks RBLK0c to RBLK63c and the sub-memory blocks RBLK0d to RBLK63d will be omitted. For example, the names of the output signals are the same as the output signals from the reset decoder group RDG corresponding to the sub-memory blocks RBLK0a to RBLK63a except that a lower case letter "c" or a lower case letter "d" is attached instead of a lower case letter "a."

One of the reset decoders RSTDEC in one of the reset decoder groups RDG may output a driver control signal DVONX, such as DVON0aX, and a word reset signal RSTZ, such as RST0aZ, in response to a. pre-decode signal GRA1X, GRA1Z, GRA0X, and GRA0Z. The pre-decode signals GRA1X, GRA1Z, GRA0X, and GRA0Z are generated by pre-decoding lower order row address signals RA1 and RA0.

Figure 9:
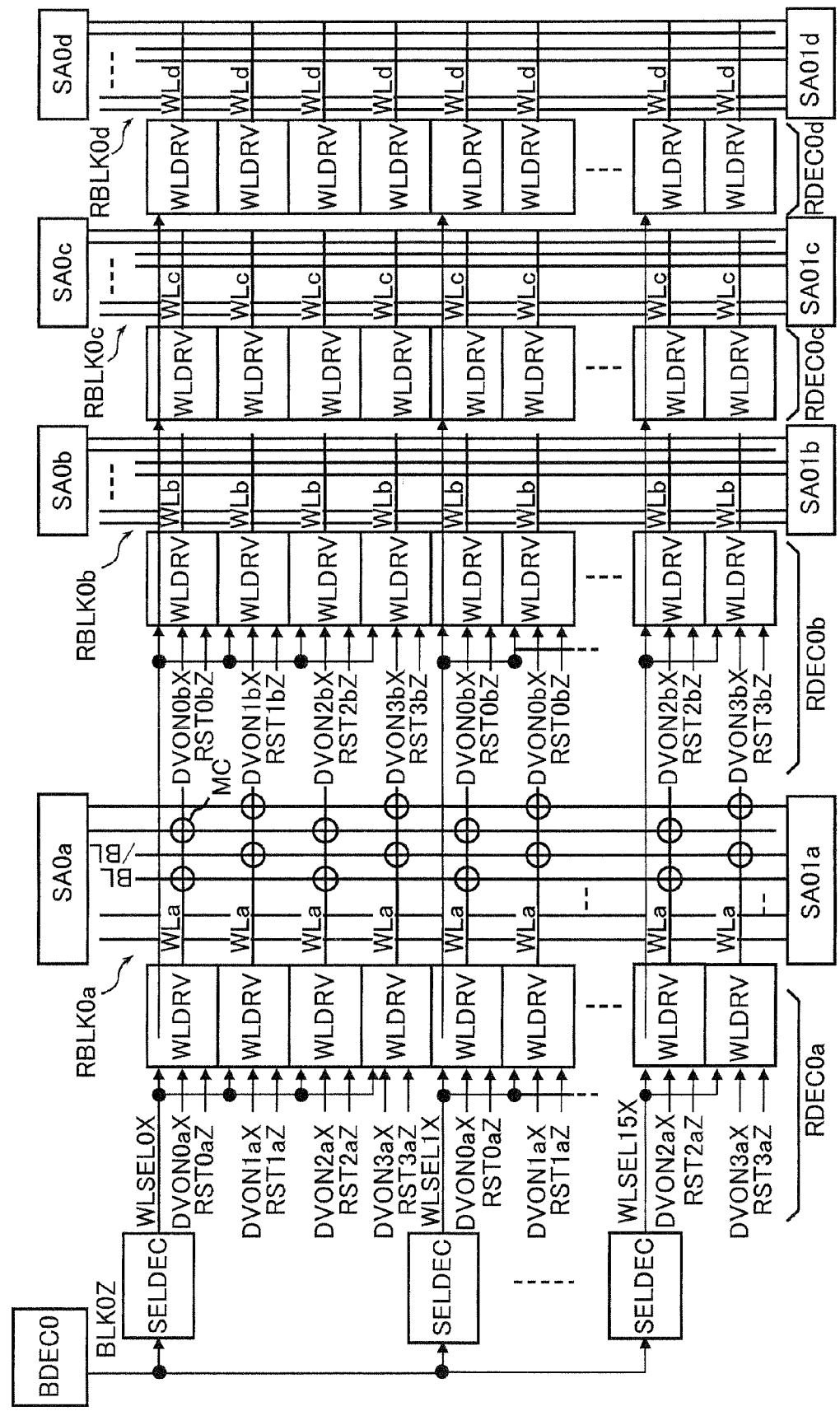
FIG. 9 illustrates an exemplary layout of the row decoder and a memory block.

FIG. 9 illustrates an exemplary layout of the row decoders RDEC0a to RDEC0d and the sub-memory blocks RBLK0a to RBLK0d, such as those illustrated in FIG. 4. A layout between the other row decoders RDEC, such as RDEC1a to RDEC1d, and the other sub-memory blocks RLBK, such as RLBK1a to RBLK1d, are the same as or similar to that illustrated in FIG. 9. The pair of bit lines BL and /BL arranged in a longitudinal direction in FIG. 9 maybe alternately coupled to columns of the sense amplifiers SA, for example, the sense amplifier SA0a or the sense amplifier SA01a, in each of the sub-memory blocks RBLK0a to RBLK0d. The memory cell MC coupled to each of the word lines WL is coupled to the bit line EL or the bit line /BL.

For example, the row decoder RDEC0a receives the shared block selection signal BLK0Z, pre-decode signals GRA5X to GRA2X (not shown), pre-decode signals GRASZ to GRA2Z (not shown), and the word control signal WLONZ (not shown), and the row decoder RDEC0a includes 16 word selection decoders SELDEC which generates word selection signals WLSELX, for example, WLSEL0X. The pre-decode signals GRA5X to GRA2X and GRA5Z to GRA2Z are generated by pre-decoding the global row address signals GRA5 to GRA2 RACZ illustrated in FIG. 1. The word selection signal WLSELX is wired to the memory blocks RBLK0a to RBLK0d and may be a main word line to activate four (4) word lines WL, for example, any one of sub-word lines. The word selection decoder SELDEC may be provided in the block decoder BDEC0. The word selection decoder SELDEC may be provided in each of the row decoders RDEC0a to RDEC0d.

Each of the row decoders RDEC0a to RDEC0d includes 64 word drivers WLDRV, each of which is coupled to any one of the word lines WL, such as, WLa, WLb, WLC, and WLd. A word driver group that includes 4 word drivers WLDRV which receives the shared word selection signal WLSELX, such as WLSEL0X, receives the driver control signals DVON0X to DVON0X, such as DVON0aX to DVON3aX, and the word reset signals RST0Z to RST3Z, such as RST0aZ to RST3aZ. The 16 word driver groups receive the shared driver control signals DVON0X to DVON3X and the word-reset signals RST0Z to RST3Z in each of the row decoders RDEC0a to RDEC0d.

Names of a part of input signals of the word drivers WLDRV corresponding to the row decoders RDEC0c to RDEC0d are omitted. The names of the input signals are the same as the names of the input signals supplied to the word drivers WLDRV corresponding to the row decoder RDEC0a except that a lower case letter "c" or a lower case letter "d" is attached instead of a lower case letter "a."

Figure 10:
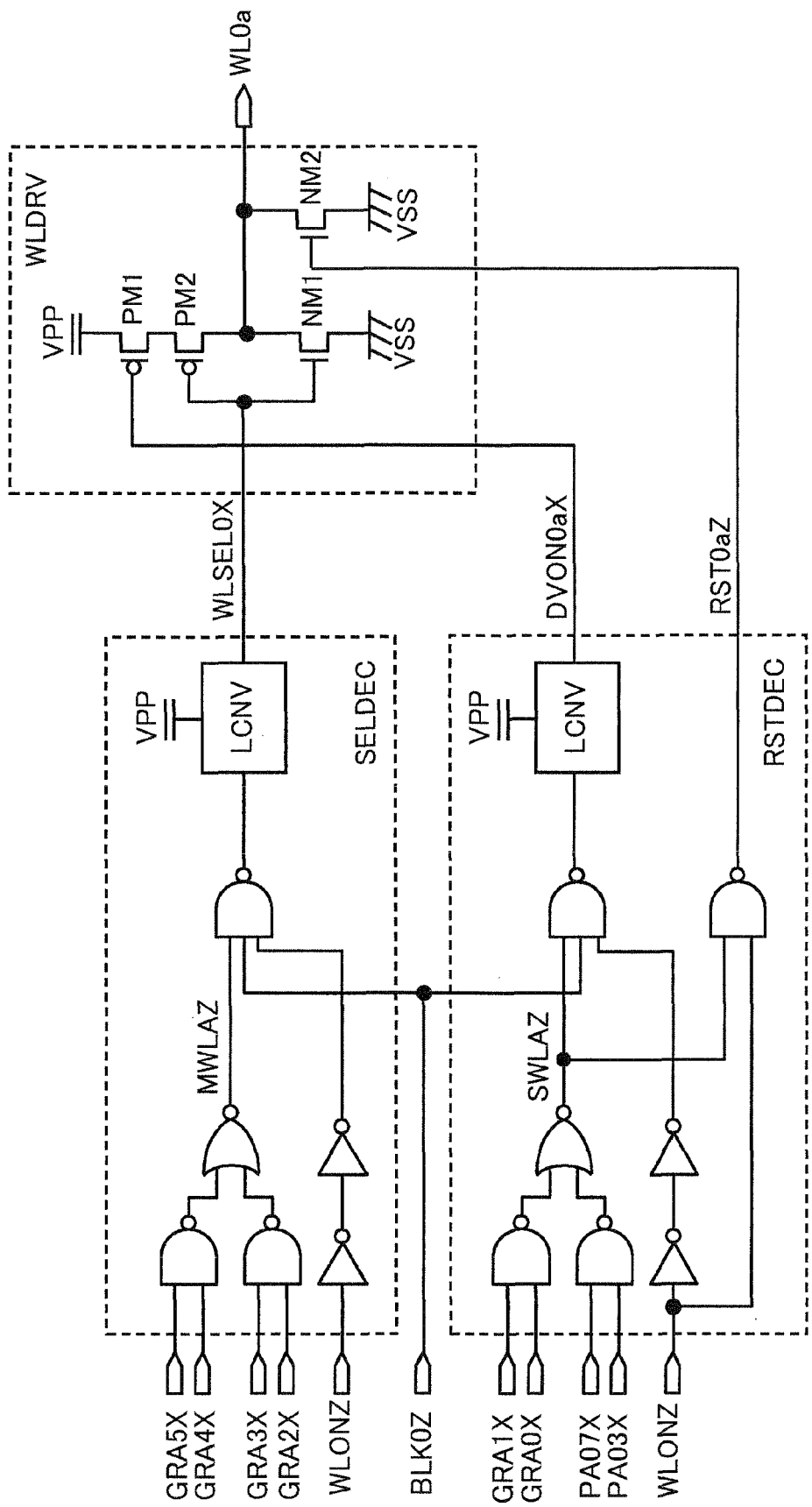
FIG. 10 illustrates an exemplary reset decoder, an exemplary word selection decoder, and an exemplary word driver.

FIG. 10 illustrates an exemplary reset decoder RSTDEC, such as is illustrated in FIG. 8 and an exemplary word selection decoder SELDEC and an exemplary word driver WLDRV each, such as are illustrated in FIG. 9. The memory block RBLK0a includes a circuit related to a word line WL0a which is activated when all of the row address signals RA5 to RA0 are "0."

The word selection decoder SELDEC activates a main word activation signal MWLAZ to a high level and activates the word selection signal WLSEL0X to a low level, in synchronization with the word control signal WLONZ, if all of the pre-decode signals GRA5X to GRA5X are a high level. The pre-decode signals GRA5X to GRA2X and GRA5Z to GRA2Z are generated by pre-decoding the global row address signals GRA5 to GRA2 such as are illustrated in FIG. 1. The word selection decoder SELDEC includes a level conversion circuit LCNV that converts the word selection signal WLSELX with a high level from an internal power supply voltage, for example, 1.6 volt to a boosting voltage VPP, for example, 2.8 volt. In one aspect, the internal power supply voltage and the boosting voltage VPP are constant voltages, which are generated by an internal voltage generation circuit provided in the memory MEM and which are not affected by variations in an external power supply voltage.

As depicted in FIG. 10, the word driver WLDRV includes a NOR gate having p-MOS transistors PM1 and PM2 coupled in series and n-MOS transistors NM1 and NM2 coupled in parallel. The word driver WLDRV sets the word line WL0a to a high level VPP if all of the word selection signal WLSEL0X, the driver control signal DRVON0aX, and the word reset signal RST0aZ are a low level. The word driver WLDRV sets the word line WL0a to a low level VSS, for example, a ground voltage if any one of the word selection signal WLSEL0X and the word reset signal RST0aZ is a high level.

The reset decoder RSTDEC activates a sub-word activation signal SWLAZ and activates the driver control signal DVON0aX and the word rest signal RST0aZ to the low level, in synchronization with the word control signal WLONZ, if the pre-decode signals GRA1X and GRA0X and the page activation signals PA07X and PA03X are the high level.

The page control circuit 20 generates the page activation signals PA07X, PA072, PA03X, and PA03Z, in response to the column addresses CA7 and CA3. When the access mode signal CMODE is being set to the low level, such as, during the horizontal access, the page activation signals PA03X and PA03Z are maintained at the high level. When the access mode signal CMODE is being set to the high level, such as, during the rectangular access, the page activation signals PA07X and PA07Z are maintained at the high level.

If the horizontal access is specified, one of the word lines WLa in the row blocks RBLKa, such as, any one of RBLK0a to RBLK63a, and one of the word lines WLb in the row blocks RBLKb, such as, any one of RBLK0b to RBLK63b, such as illustrated in FIG. 4, are contemporaneously activated. Alternatively, one of the word lines WLc in the row blocks RBLKc, such as, any one of RBLK0c to RBLK63c, and one of the word lines WLd in the row blocks RBLKd, such as, any one of RBLK0d to RBLK63d, are contemporaneously activated. One of the word lines WLa in the row blocks RBLKa, such as, any one of RBLK0a to RBLK63a, and one of the word lines WLc in the row blocks RBLKc, such as, any one of RBLK0c to RBLK63c, are contemporaneously activated if the rectangular access is specified. Alternatively, one of the word lines WLb in the row blocks RBLKb, such as, any one of RBLK0b to RBLK63b, and one of the word lines WLd in the row blocks RBLKd, such as, any one of RBLK0d to RBLK63d, are contemporaneously activated.

Figure 11:
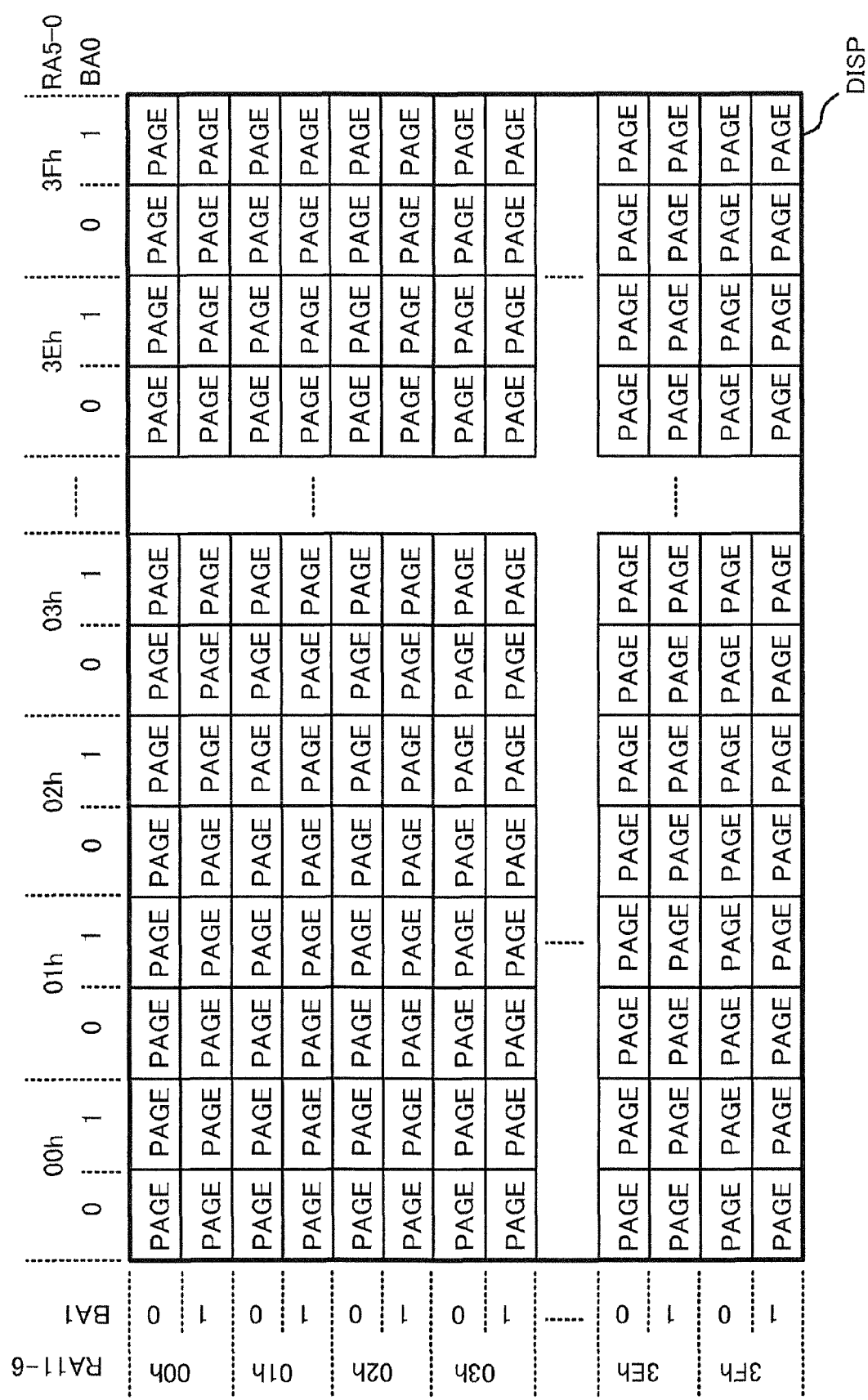
FIG. 11 illustrates an exemplary address map.

FIG. 11 illustrates an exemplary address map of pixels in a display device DISP, such as the display device illustrated in FIG. 2. For example, the display device DISP includes 1920 pixels in a lateral direction and 1080 pixels in a longitudinal direction. The memory MEM RACZ illustrated in FIG. 1 includes a memory capacity capable of at least storing image data equivalent to one image plane of the display device DISP at a time. An amount of information to display one pixel that includes three (3) colors, such as RGB, may be, for example, 32 bits in the first embodiment. For this reason, image data equivalent to one pixel is held in 32 memory cells MC assigned to one address.

For example, one image plane may include pages PAGE, and 64 pages PAGE may be arranged both in a lateral direction and in a longitudinal direction. As illustrated in FIG. 12, each page PAGE may be divided into 256 column addresses, for example, 16 addresses in the lateral direction and 16 addresses in the longitudinal direction. Since the page PAGE includes the pixels arranged in the rectangular shape, accessing the memory MEM by the image data control unit IMGCNT, which encodes or decodes pixel data arranged in a rectangle, may be effectively performed.

The pages PAGE adjacent to one another are assigned to different banks BK3 to BK0 based on bank addresses BA1 to BA0. The bank addresses BA1 and BA0 are assigned to orders lower than those of the row addresses RA11 to RA0. Since the bank addresses BA1 and BA0 are assigned to lower orders and accessing the memory MEM is sequentially performed across the adjacent pages PAGE, an operation of switching the word lines WL of the bank BK may be masked by an access operation by another bank BK. Consequently, accessing the memory MEM may be effectively performed.

FIG. 12 illustrates an exemplary address map in the page PAGE illustrated in FIG. 11. Numerals in the page PAGE, for example, hexadecimal numbers, may represent allocation of 256 column addresses. The page PAGE may include 64 column addresses, for example, four (4) areas (that is, area a to area d), divided with respect to each set of eight (8) lateral addresses and each set of eight (8) longitudinal addresses. The area a to area d are mapped with the column addresses CA7 and CA3. The area a to the area d may include, for example, the memory cells MC coupled to one of the word lines WLa to WLd of the memory blocks RBLK0a to RBLK0d, such as those illustrated in FIG. 4. Each of the areas a to d is accessed by different row decoders RDECa to RDECd.

FIG. 13 illustrates an exemplary relationship between the pixels in the page PAGE illustrated in FIG. 12 and the column addresses. Since the memory MEM according to the first embodiment includes the data terminals DQ of 32 bits, one column address CA may access 32 bit data DQ0 to DQ32. For example, R (red), G (green), and B (blue) elements that form one pixel represent an 8-bit gradation level (DQ0 to DQ7, DQ8 to DQ15, and DQ16 to DQ23). The data DQ24 to DQ32 is reserved elements RSV. The reserved elements RSV may be used, for example, when at least one of the number of RGB gradation levels is increased. The reserved elements RSV are used when colors of pixels and luminance are adjusted. The RGB elements may be arranged, for example, in a lateral direction of FIG. 13 in a display device DISP illustrated in FIG. 11.

Figure 14:
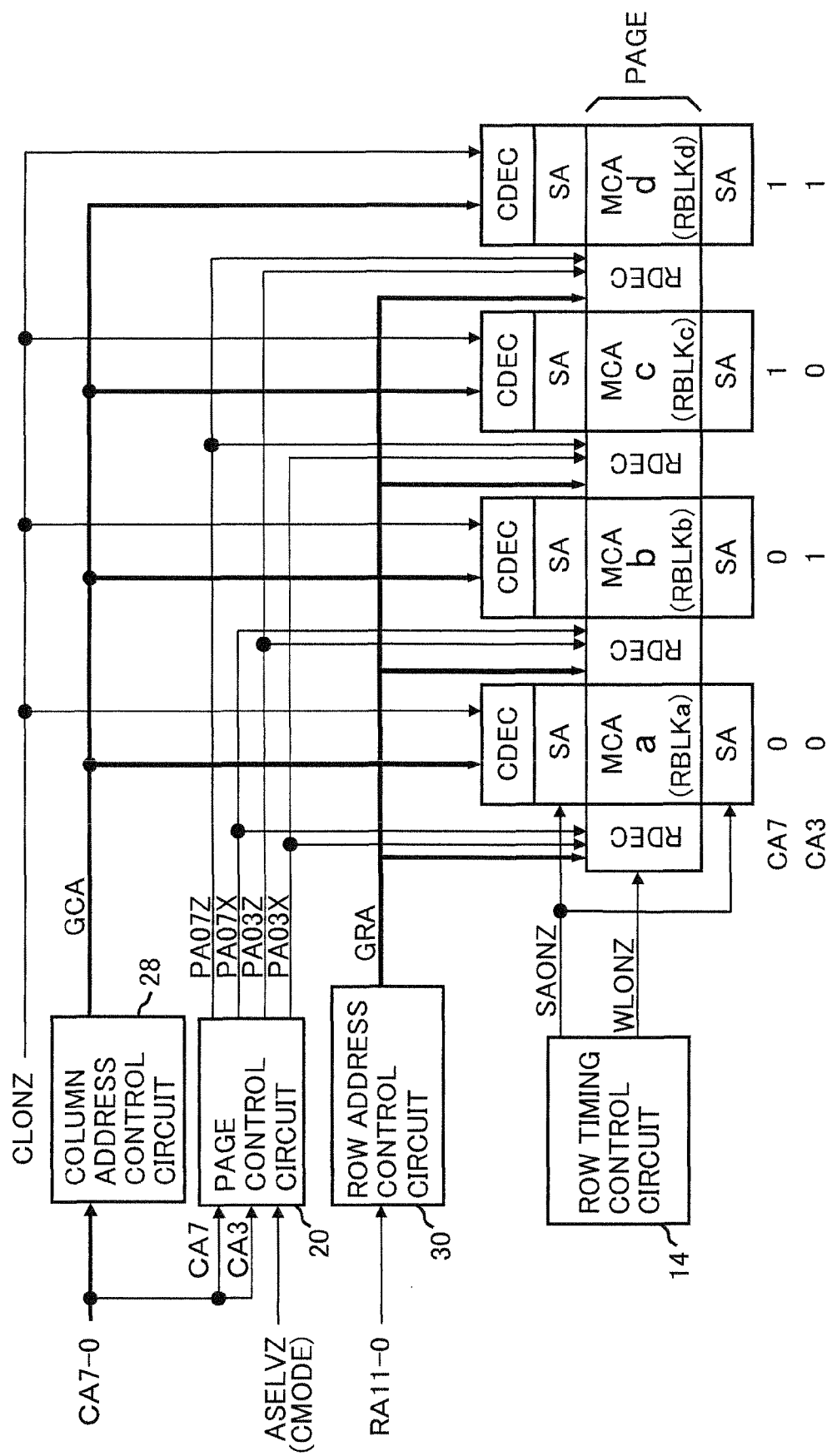
FIG. 14 illustrates an exemplary control circuit that accesses the page.

FIG. 14 illustrates an exemplary control circuit to access a page PAGE, such as the PAGE illustrated in FIG. 12. A memory cell area MCAa to a memory cell area MCAd in FIG. 14 correspond to the area a to the area d illustrated in FIG. 12 and include memory cells equivalent to one page. Each of the memory cells MC in each of the memory cell areas MCAa to MCAd is coupled to one of the word lines WL, such as, WLa to WLd, such as the word lines illustrated in FIG. 4.

For example, the access mode signal CMODE with the low level is supplied to the memory MEM and the rectangular area selection signal ASELVZ is set to the low level. In the above case, the page control circuit 20 sets the page activation signals PA03Z and PA03X to the high level and sets the page activation signal PA07Z and PA07X to a level that corresponds to the column address CA7. The memory cell areas MCAa and MCAb adjacent to one another are accessed or the memory cell areas MCAc and MCAd adjacent to one another are accessed. The word lines WLa to WLd, each extending in the lateral direction such as depicted in FIG. 4 and obtained by dividing the word WL into four (4), are activated by the adjacent division unit, for example, by a unit of WLa and WLb or by a unit of WLc and WLd. The adjacent division unit may be the word line WL, for example, WLa and WLb (CA7=0) or WLc and WLd (CA7=1), whose upper-order CA7 in the column address signals CA7 and CA3 is the same.

The access mode signal CMODE with the high level is supplied to the memory MEM and the rectangular area selection signal ASELVZ is set to the high level. In the above case, the page control circuit 20 forcibly sets the page activation signals PA07Z and PA07X to the high level and sets the page activation signals PA03Z and PA03X to the level that corresponds to the column address CA3. The memory cell areas MCAa and MCAc that are non-adjacent to one another or the memory cell areas MCAb and MCAd that are non-adjacent to one another are accessed. In other words, the word lines WLa to WLd, each extending in the lateral direction such as depicted in FIG. 4 and obtained by dividing the word WL into 4, maybe activated by the non-adjacent division unit, for example, WLa and WLc or WLb and WLd. The non-adjacent division unit may be the word lines WL, for example, WLa and WLc (CA3=0) or WLb and WLd (CA3=1) whose lower-order CA3 in the column address signals CA7 and CA3 is the same.

Since the memory cell area MCA, activated in response to types of image processing of the image data, is switched, a minimum of the memory cell area MCA, for example, the word line WL, is activated. The memory cell areas MCA, which are not accessed, are selectively deactivated in response to the types of the image processing. A reduction in power consumption of the memory MEM may be achieved regardless of the types of the image processing.

FIG. 15 illustrates an exemplary horizontal access to a memory MEM, such as the memory MEM illustrated in FIG. 1. In the horizontal access, the memory controller MCNT outputs the access mode signal CMCDE with the low level in response to the horizontal access request HREQ from the display data control unit DSIPCNT illustrated in FIG. 2. In the first embodiment, the memory controller MCNT outputs a column address signal CA7 (AD7) with a logic zero (0) and a column address signal CA3 (AD3) with a logic zero (0) to the memory MEM. The access mode signal CMODE with the low level masks a logic of the column address signal CA3. Therefore, an area a and an area b, surrounded by a bold line, are activated. For example, the area a and the area b may correspond to an odd-number division part WLa and an even-number division part WLb among the divided word lines WLa, WLb, WLc, and WLd.

For example, column address signals CAD7 to CAD4 represented as a binary digit "0100" are supplied to the memory MEM along with the read command. The image data is sequentially read from a shaded area by column address signals CAD3 to CAD0 from "0000" to "1111" being sequentially supplied to the memory MEM. The display data control unit DISPCNT outputs the image data thus read to the display unit DISP (line sequential scanning) to display the image on a display line, extending in the horizontal direction, on the display unit DISP. The area a and the area b are activated along with a pixel arrangement on the display lines, and an area c and an area d without relation to the display lines are deactivated. Consequently, a reduction in power consumption of the memory MEM may be achieved.

Figure 16:
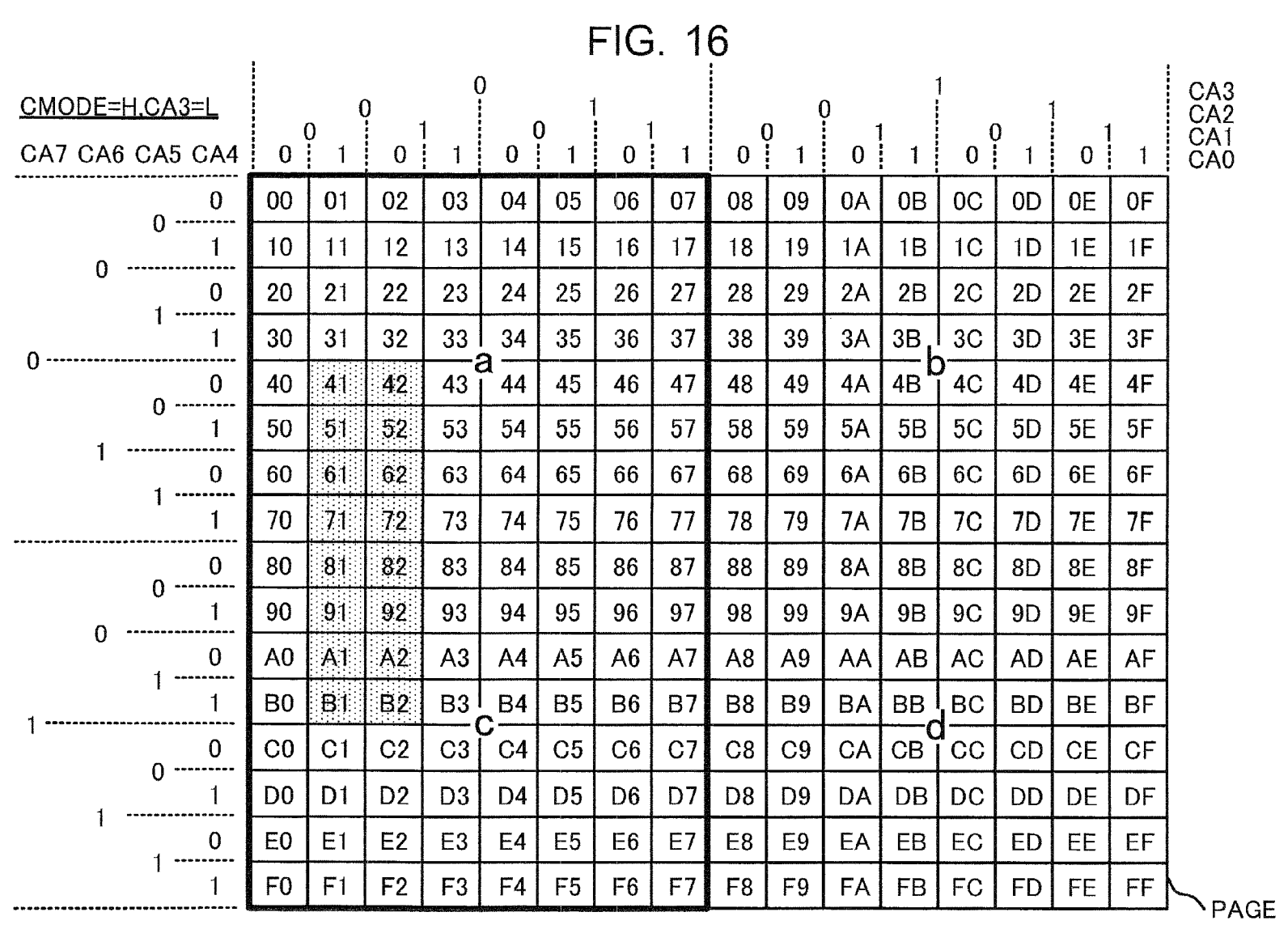

FIG. 16 illustrates an exemplary rectangular access to a memory MEM, such as the memory MEM illustrated in FIG. 1. In the rectangular access, the memory controller MCNT outputs the access mode signal CMODE with the high level in response to the rectangular access request RREQ from the image data control unit IMGCNT illustrated in FIG. 2. In the first embodiment, the memory controller MCNT outputs the column address signal CA7 (AD7) with the logic zero (0) and the column address signal CA3 (AD3) with the logic zero (0) to the memory MEM. The access mode signal CMODE with the high level masks a logic of column address signal CA7. Therefore, an area a and an area c, surrounded by the bold are activated. For example, the area a and the area c may correspond to the odd-number division parts Wria and WLc among the divided word lines WLa, WLb, WLc, and WLd.

In the rectangular access, for example, the image data may be read and written by a minimum code unit (Mail, having eight (8) elements in a lateral direction and eight (8) elements in a longitudinal direction. For example, each of areas, specified by column addresses CA=41 and CA=42, includes image data having four (4) elements, which include the reserved element RSV, in a lateral direction. An MCU area represented as a shaded area in FIG. 16, that is, 41, 42, 51, 52 to B1 and B2, holds image data that corresponds to 64 elements.

The shaded MCU area is accessed by the read command being supplied and by the column address CA being changed, and the image data is sequentially read. The image data control unit IMGCNT encodes the image data read to write to the external memory EMEM. The shaded MCU area is accessed by the write command being supplied and by the column address CA being changed, and the decoded image data is sequentially written to the memory MEM. The shaded MCU area is included in the area a and the area c, each specified by the column address CA3=0, but the shaded MCU area is not included in the area b and the area d, each specified by the CA3=1. Since the area b and the area d are not activated, a reduction in power consumption of the memory MEM may be achieved.

As illustrated in FIGS. 15 and 16, the memory blocks RBLK corresponding to the area a and the area b or the area c and the area d, each arranged in a lateral direction along the display line, are activated in the horizontal access. The reduction in power consumption may be achieved. In the rectangular access, the memory blocks RBLK corresponding to the area a and the area c or the area b and the area d, each arranged in a longitudinal direction that intersects the display line, are activated. The reduction in power consumption may be achieved. For example, the memory blocks RBLK corresponding to the area a and the area b or the area c and the area d, each arranged in the lateral direction, may be activated contemporaneously with the horizontal access. In the rectangular access, the memory blocks RBLK corresponding to the four (4) areas a to d may be activated.

Suppose that the memory blocks RBLK corresponding to the area a and the area c or the area b and the area d, each arranged in the longitudinal direction, are activated along with the rectangular access. In the horizontal access, the memory blocks RBLK corresponding to the four (4) areas a to d may be activated. For this reason, it may be difficult to minimize the power consumption of the memory MEM in a plurality of operation modes in the image processing.

In the first embodiment, the word lines WL are activated in units of the memory blocks RBLKa to RBLKd based on the row address signal RA and a part of the column address signal CA. In consequence, since the word line WL necessary for the access is activated, the reduction in power consumption of the memory MEM may be achieved. The memory block RBLK is divided into 4 sub-memory blocks RBLKa, RBLKb, RBLKC, and RBLKd (4 sub-word lines WLa, WLb, WLc, and WLd) identified based on the column addresses CA7 and CA3. As such, changing activation patterns of the sub-memory blocks RBLKa to RBLKd in response to the operation modes allows minimizing the power consumption of the memory MEM.

Changing the activation patterns of the sub-memory blocks RBLKa to RBLKd in response to the operation modes based on the types of the image processing allows minimizing the power consumption of the memory MEM, which holds the image data, regardless of the operation modes. The memory MEM maybe effectively accessed in response to the operation modes by matching the arrangement of the sub-memory blocks RBLKa to RBLKd (sub-word line WLa to WLd) to be divided and the pixel arrangement of the display device DISP.

The operation mode is identified with the access mode signal CMODE received at the external terminal, and switching of the operation modes in response to requests by external devices, which accesses the memory MEM, is efficiently performed. Changes in the memory controller MCNT is minimized by information on the rectangular access and the horizontal access, which is used for calculating the addresses or the like in the memory controller MCNT, being supplied as the access mode signal CMODE to the memory MEM.

The first embodiment may be applicable to, for example, the pseudo-SRAM, where the column address signal CA is supplied along with the row address signal RA. In response to the logic of the column addresses CA7 and CA3, control of the sense amplifier control circuit SCNT and the row decoder RDEC may be facilitated. Logic design and timing design for circuits, which generate the signals supplied to the sense amplifier control circuit SCNT, the row decoder RDEC, and the other circuit blocks, may be facilitated.

Figure 17:
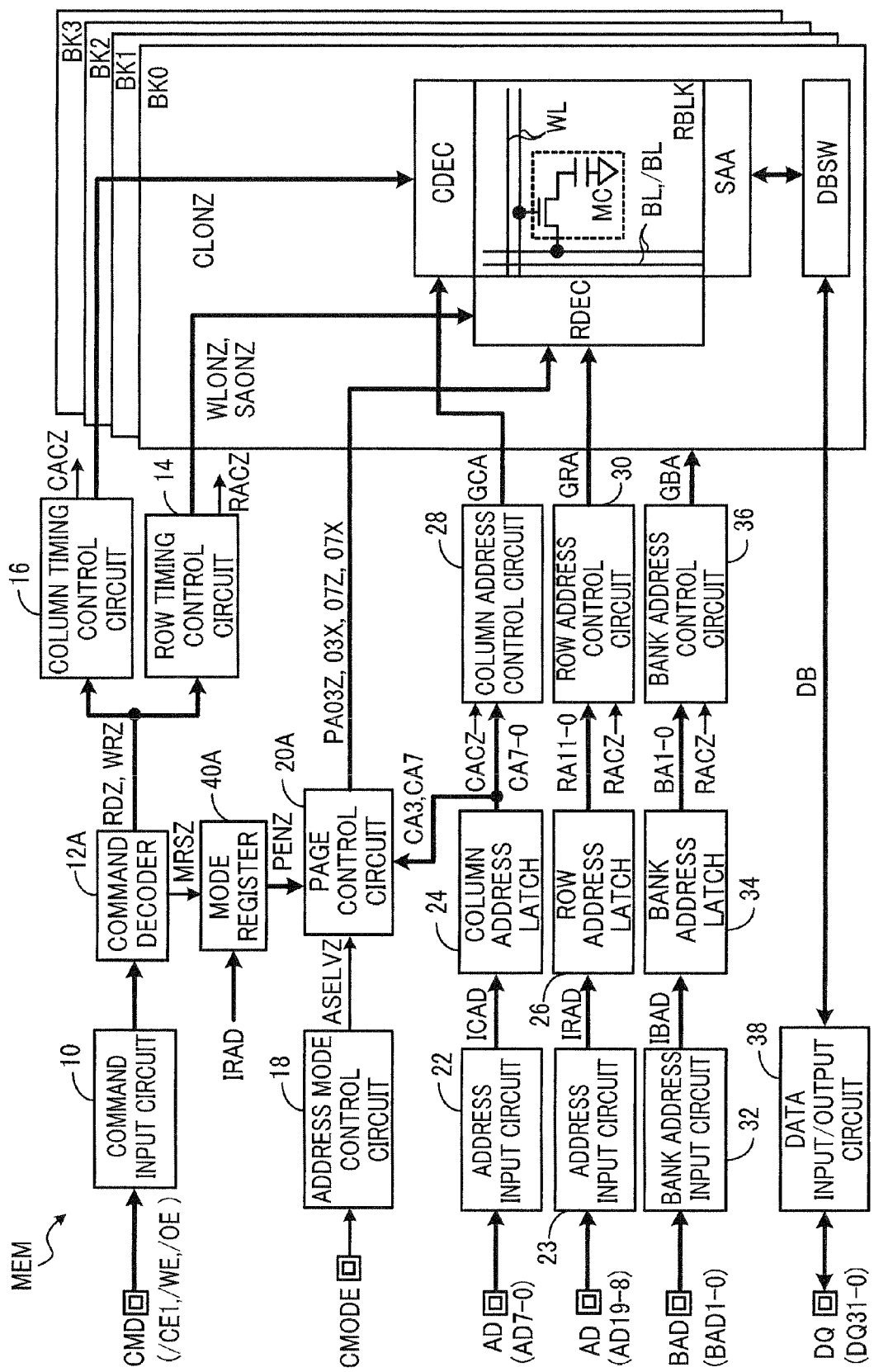
FIG. 17 illustrates a second embodiment.

FIG. 17 illustrates a second embodiment. In the second embodiment, the same numerical references and reference symbols are given to the same elements as those shown in the first embodiment and detailed descriptions thereof will be reduced or omitted. A memory MEM according to the second embodiment includes a command decoder 12A and a page control circuit 20A instead of the command decoder 12 and the page control circuit 20 illustrated in FIG. 1. The memory MEM further includes a mode register 40A. Other structures of the memory MEM are the same as or similar to the structures illustrated in FIG. 1. The semiconductor memory MEM may be, for example, an FORAM of a pseudo-SRAM type.

The command decoder 12A includes the function that a command decoder, such as the command decoder 12 illustrated in FIG. 1 has and outputs a mode register setting command signal MRSZ to set a mode register 40A. For example, the mode register setting command signal MRSZ may be output when the command decoder 12A receives a given command signal CMD and an address signal AD an given number of times. The mode register setting command signal MRSZ is output upon receipt of a combination of command signals CMD, which is unused in a normal access operations.

The mode register 40A includes a plurality of registers, which may be set, for example, in response to row address signals IRAD, in synchronization with the mode register setting command signal MRSZ. The mode register 40A may be set by a column address signal ICAD or a data signal DQ. The mode register 40A may also be called as a "configuration register."

The mode register 40A may include, for example, a page control register that holds a row address signal RA0 received along with the mode register setting command signal MRSZ. Values held in the page setting register are output as a page control enable signal PENZ.

The page control circuit 20A includes the function that the page control circuit 20 illustrated in FIGS. 1 and 3 has and sets page activation signals PA032, PA03X, PA07Z, and PA07X to a high level upon receipt of a page control enable signal PENZ with a low level. Four (4) memory cell areas MCAa to MCAd (RBLKa to RBLRd) illustrated in FIG. 14 are contemporaneously activated by the page activation signals PA03Z, PA03X, PA07Z, and PA07X being set to the high level.

Figure 18:
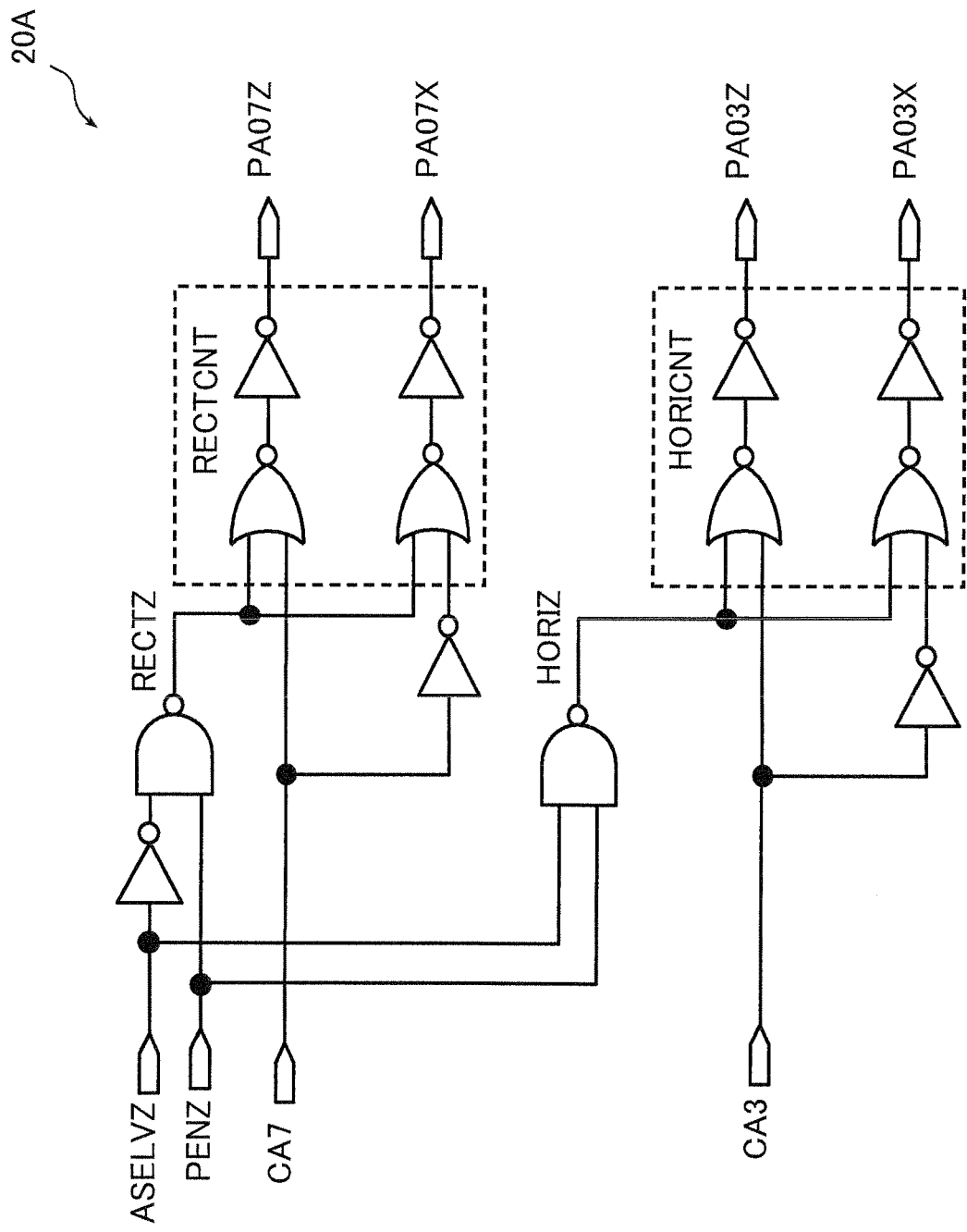
FIG. 18 illustrates an exemplary page control circuit.

FIG. 18 illustrates an exemplary page control circuit 20A illustrated in FIG. 17. The page control circuit 20A includes NAND gates that receive the page control enable signal PENZ to output a rectangular signal RECTZ and a horizontal signal HORIZ, respectively. Other structures of the page control circuit 20A are the same as or similar to those of the page control circuit 20 illustrated in FIG. 3. If the page control enable signal PENZ is at the low level by the NAND gates, the rectangular signal RECTZ and the horizontal signal HORIZ are activated to high levels regardless of a level of a rectangular area selection signal ASELVZ. A rectangular control circuit RECTCNT outputs the page activation signals PA07Z and PA07X with the high level regardless of a value of a column address signal CA7. A horizontal control circuit HORICNT outputs the page activation signals PA03Z and PA03X with the high level regardless of a value of a column address signal CA3.

For example, upon a block selection signal BLK0Z being activated, eight (8) sense amplifier control circuits SCNT illustrated in FIG. 7 activate sense amplifier activation signals NSA and PSA, in response to the page activation signals PA07Z, PA07X, PA03Z, and PA03X with the high level. All of sense amplifier SA0a to SA0d and SA01a to SA01d corresponding to memory blocks RBLK0a to RBLK0d are activated. Four (4) reset decoders RSTDEC, receiving shared pre-decode signals GRA1 and GRA0 (for example, GRA1X and GRA0X) illustrated in FIG. 8, activate driver control signals DVON0aX to DVON0dX and word reset signals RST0aZ to RST0dZ. Four (4) word drivers WLDRV, corresponding to the memory blocks RBLK0a to RBLK0d illustrated in FIG. 9, activate divided word lines WLa. to WLd.

If the page control enable signal PENZ is at the low level, control by the column address signals CA7 and CA3 is masked. In response to row address signals RA11 to RA0, an area a to an area d in a page PAGE, such as the PAGE illustrated in FIG. 12, are activated.

When the page control enable signal PENZ is at the high level, an operation thereof is the same as or similar to that of the first embodiment. The two (2) NAND gates judge a unit for activating the word lines WLa to WLd. For example, a memory controller MCNT, such as the memory controller illustrated in FIG. 2, may access the mode register 40A to set the page control enable signal PENZ to the low level if both of a horizontal access request HREQ and a rectangular access request RREQ are a low level. The memory controller MCNT illustrated in FIG. 2 accesses the mode register 40A to set the page control enable signal PENZ to the low level when image data is read from three (3) or more areas in the page PAGE or the image data is written to the three (3) or more areas in the page PAGE.

The second embodiment has the substantially similar advantageous effects as those of the first embodiment. In the second embodiment, the divided word lines WLa to WLd are activated depending on values set to the mode register 40A, regardless of the levels of the access mode signal CMODE. For example, the memory MEM having a page address access function may access the 3 or more areas among the areas a to d in the page PAGE without the word lines WLa to WLd being switched. The data transfer rate may be improved since the read operation or the write operation may be sequentially performed while an activation state of the word line WL is maintained by the column address CA being sequentially switched when accessing the page address. A power consumption may be set to minimum in response to operation modes based upon types of image processing. The access may be effectively performed when the image data in the three (3) or more areas in the page PAGE is accessed.

Figure 19:
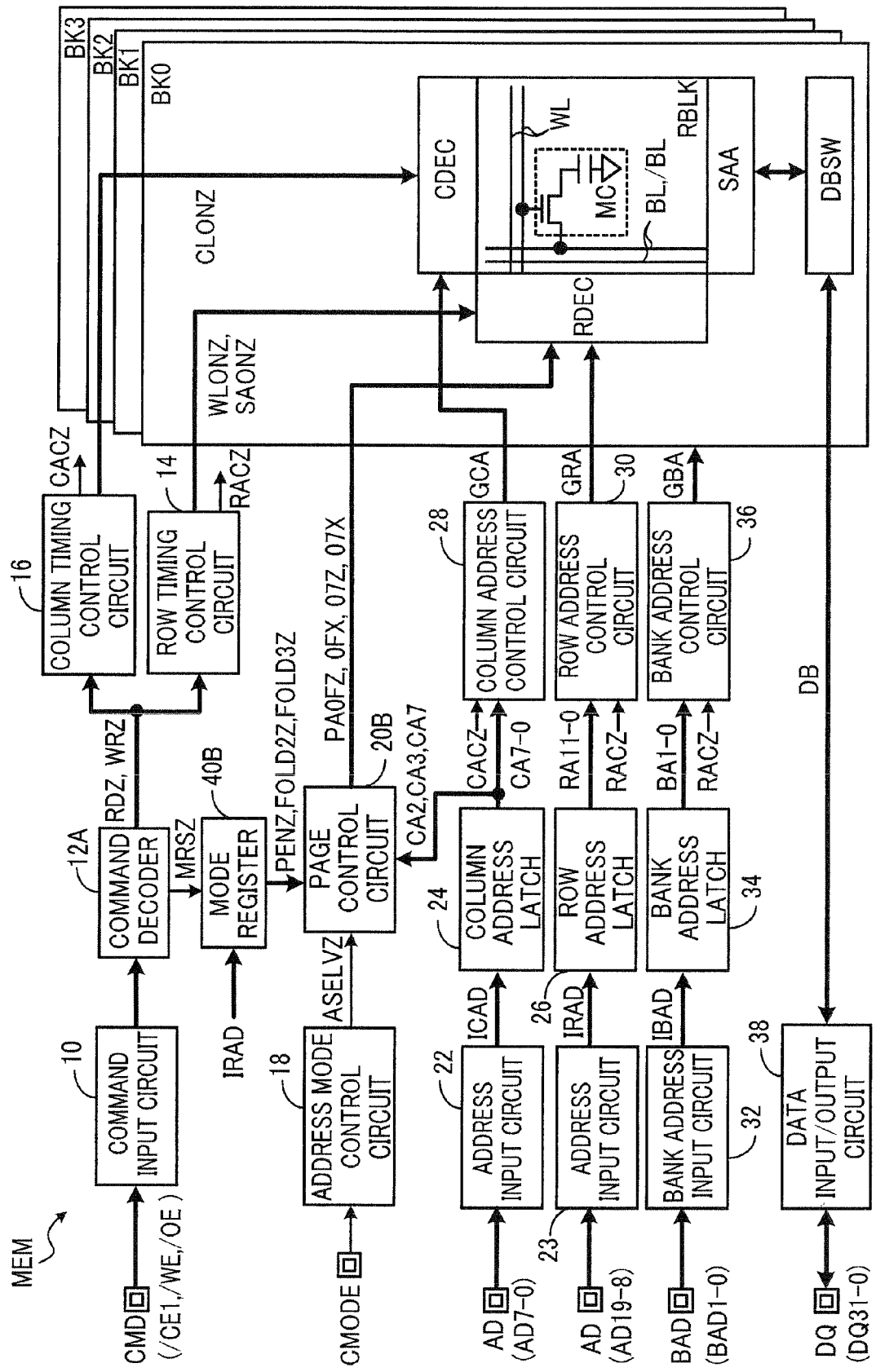
FIG. 19 illustrates a third embodiment.

FIG. 19 illustrates a third embodiment. In the third embodiment, the same numerical references and reference symbols are given to the same elements as those shown in the other embodiments, and detailed descriptions thereof will be reduced or omitted. A memory MEM according to the third embodiment includes a mode register 40B and a page control circuit 20B instead of the mode register 40A and the page control circuit 20A illustrated in FIG. 17. Other structures of the memory MEM are the same as or similar to those illustrated in FIG. 17 except that a row decoder RDEC, a sense amplifier control circuit SCNT, and a memory block RBLa are different therefrom. The semiconductor memory MEM may be an FCRAM of a pseudo-SRAM type.

The mode register 40B includes the function that the mode register 40A illustrated in FIG. 17 has and may include, for example, a loopback control register that holds row address signals RA1 and RA0 received along with a mode register setting command signal MRSZ. The values, held in the loop-back control register, are output as loop-back signals FOLD2Z and FOLD3Z. The page control circuit 20B includes the function that the page control circuit 20A illustrated in FIG. 18 has and generates page activation signals PA0FZ and PA0FX in response to at least one of column address signals CA2 and CA3 and the loop-back signals FOLD2Z and FOLD3Z.

Figure 20:
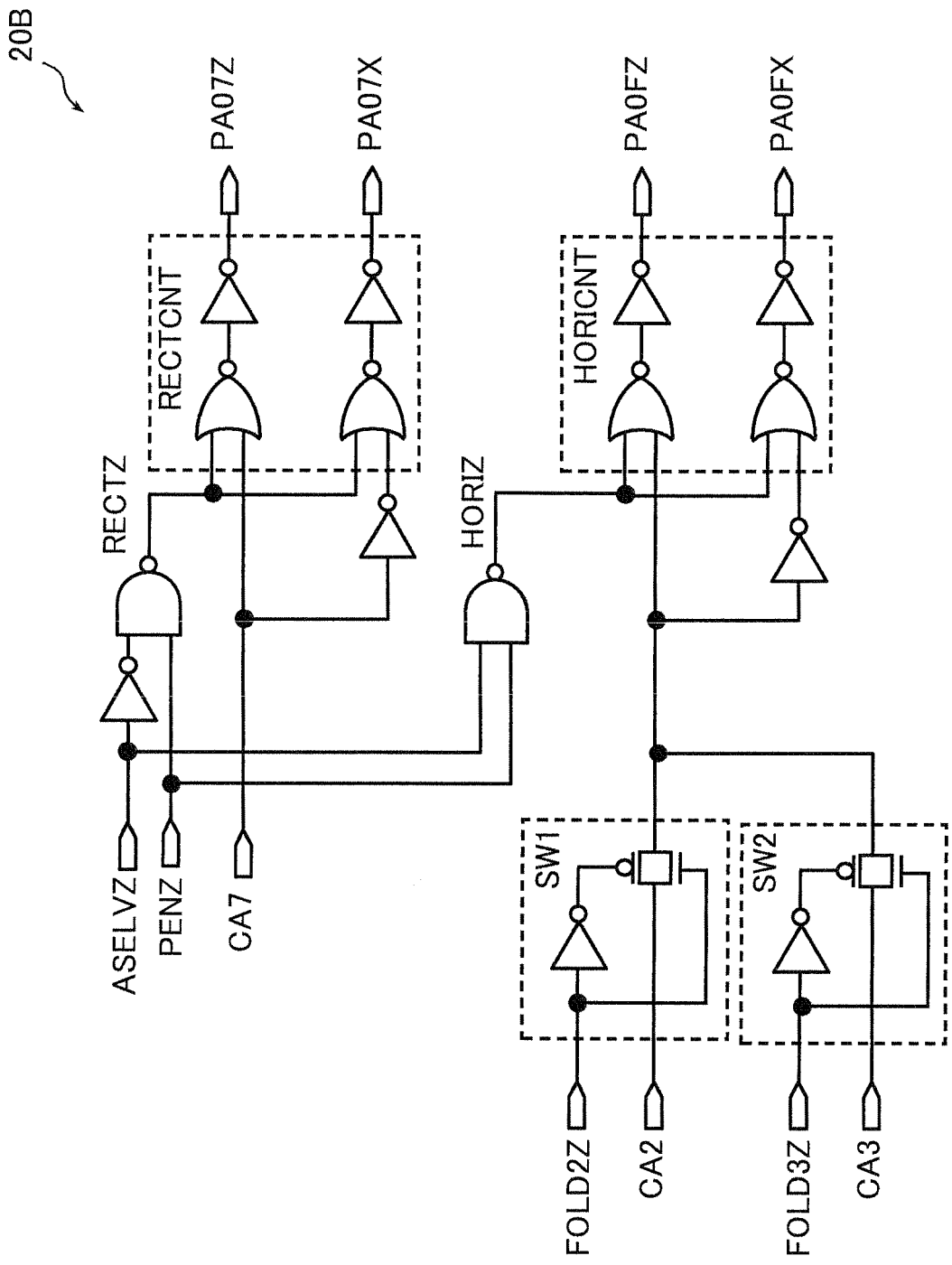
FIG. 20 illustrates an exemplary page control circuit.

FIG. 20 illustrates an exemplary page control circuit 20B 20B illustrated in FIG. 19. The page control circuit 20B is the same as or similar to the page control circuit 20A illustrated in FIG. 18 except that the page control circuit 20B includes at least switches SW1 and SW2. The switch SW1 is switched ON when the loopback signal FOLD2Z is a high level and transmits the column address signal CA2 to a horizontal control circuit HORICNT. The switch SW2 is switched ON when the loopback signal FOLD3Z is a high level and transmits the column address signal CA3 to the horizontal control circuit HORICNT.

Figure 21:
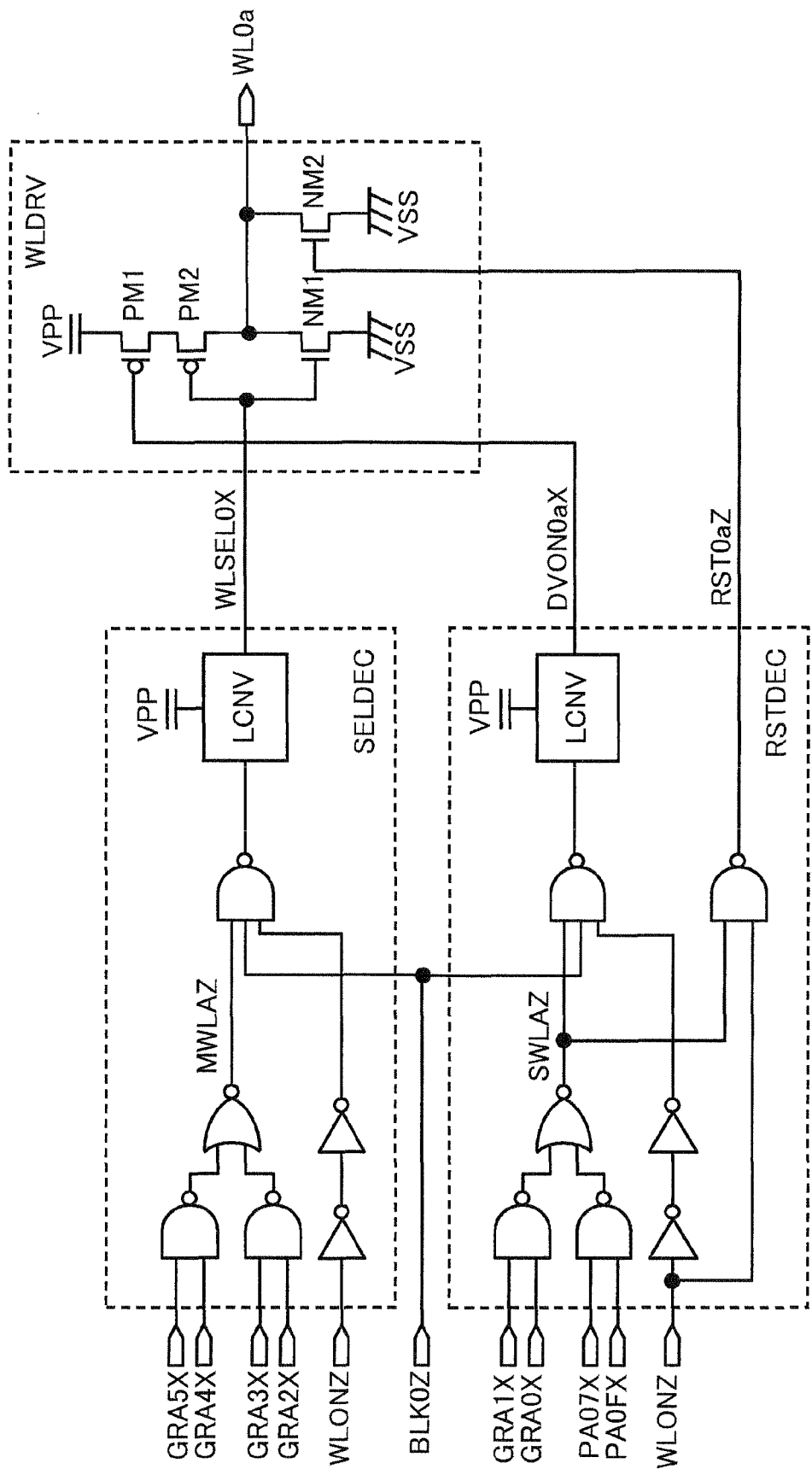
FIG. 21 illustrates an exemplary row decoder.

FIG. 21 illustrates an exemplary row decoder RDEC illustrated in FIG. 19. Different from the first and the second embodiments, a reset decoder RSTDEC receives the page activation signal PA0FX or the page activation signal PA0FZ instead of the page activation signal PA03X or the page activation signal PA03Z. Other structures of the row decoder RDEC are the same as or similar to those illustrated in FIG. 10.

Figure 22:
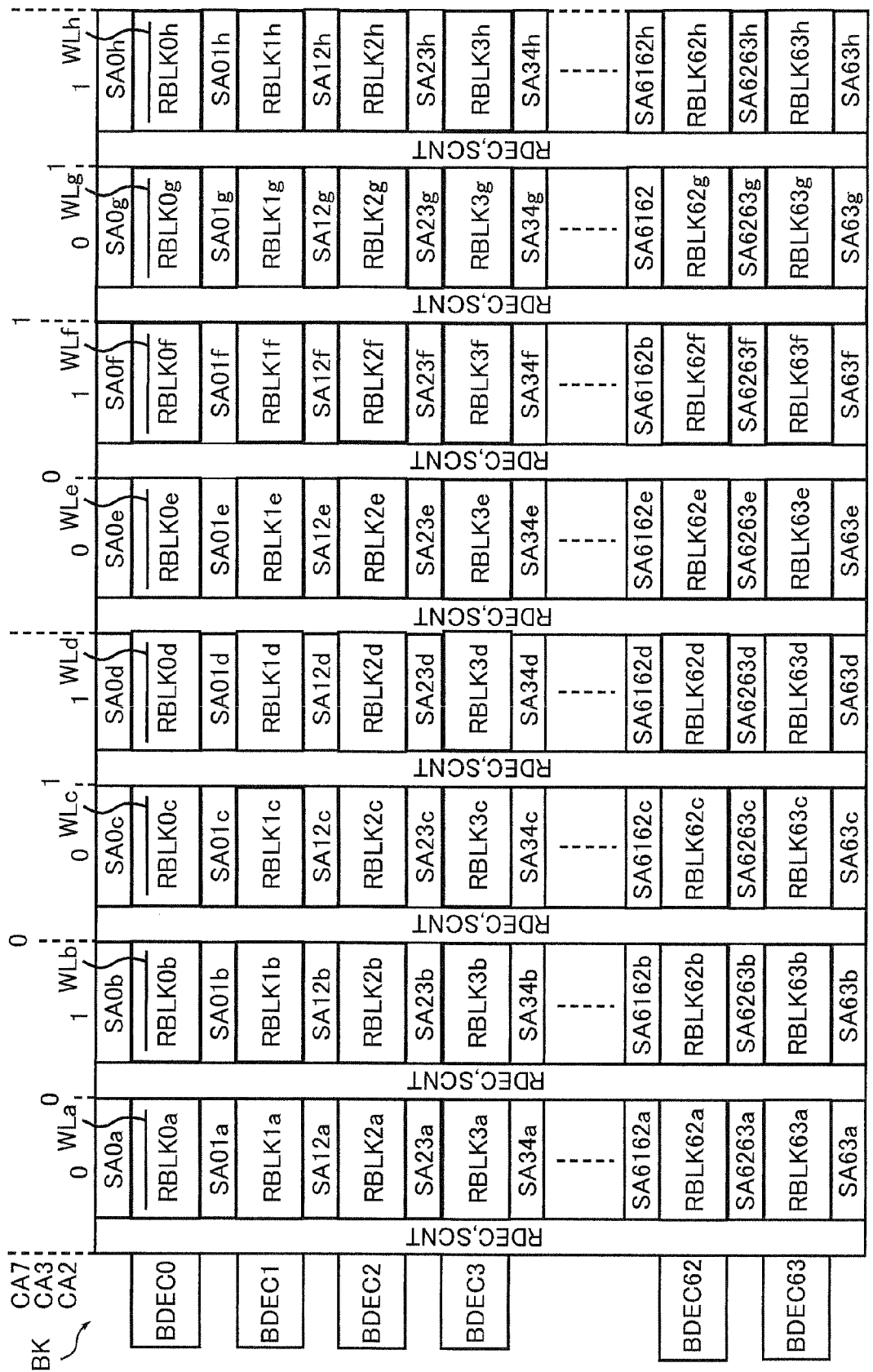
FIG. 22 illustrates an exemplary bank layout.

FIG. 22 illustrates an exemplary layout of banks BK (BK0 to BK3) illustrated in FIG. 19. Each bank BK includes 64 main-memory blocks RBLK (RBLK0 to RBLK63), which are identified with high-order row addresses RA11 to RA6. Each main-memory block RBLK may include sub-memory blocks RBLKa, RBLIth, RBLKc, RBLKd, RBLKe, RBLKf RBLKg, and RBLIch, each of which is identified with the column addresses CA2, CA3, and CA7, for example, RBLK0a, RBLK0b, RBLK0c, RBLK0d, RBLK0e, RBLK0f, RBLK0g, and RBLK0h.

A word line WL, as depicted in FIG. 22, extending in a lateral direction in the main-memory blocks RBLK 22 is divided (such as, WLa, WLb, WLc, WLd, WLe, WLf, WLg, and WLh) with respect to each sub-memory block, such as, RBLKa to RBLK.h. The divided word lines WLa to WLh are selected by the column address signal CA7, CA3, or CA2 and arranged according to the order of addresses. The row decoder RDEC and the sense amplifier control circuit SCNT are arranged with respect to each of the sub-memory block, such as, RBLKa to RBLKh. Other structures of the banks BK are the same as or similar to those in FIG. 4.

FIG. 23 illustrates an exemplary address map in a page Page illustrated in FIG. 11. In the third embodiment, the page PAGE includes eight (8) areas, that is, an area a to an area h. Each of the eight (8) areas is divided into 32 column addresses, that is, four (4) addresses in a lateral direction and eight (8) addresses in a longitudinal direction. The area a to the area h are mapped with the column addresses CA7, CA3, and CA2. The area a to the area h may include, for example, memory cells MC coupled to one of the word lines WLA to WLh of the memory blocks RBLKDa to RBLK0h, such as those illustrated in FIG. 22. The area a to the area h are accessed by the different row decoders RDECa to RDECh, respectively.

Figure 24:
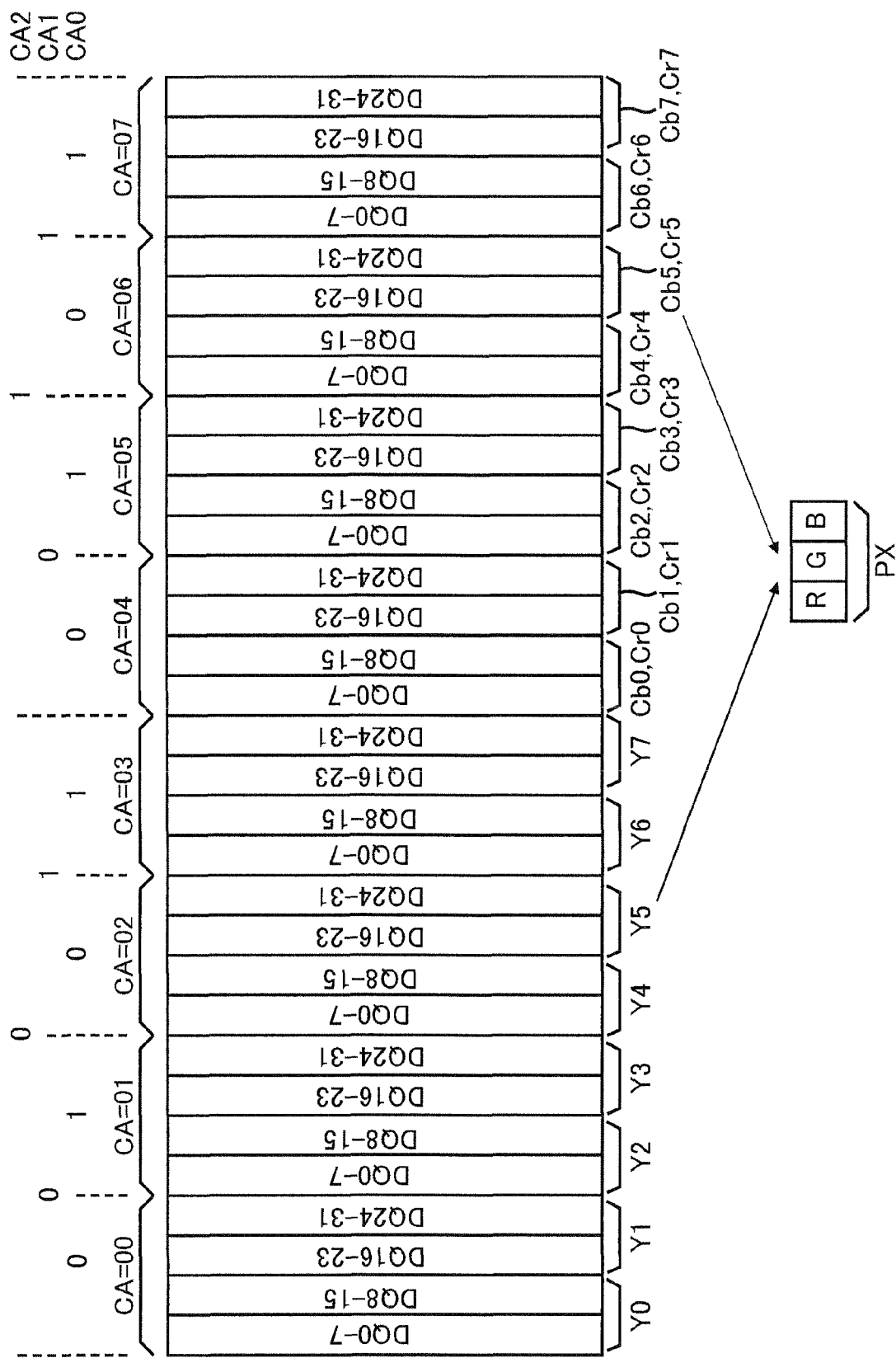
FIG. 24 illustrates an exemplary relationship between pixels in the page and column addresses.

FIG. 24 illustrates an exemplary relationship between pixels in the page PAGE illustrated in FIG. 23 and the column addresses. In the third embodiment, image data includes Y-data, that is, a luminance component, Cb-data, that is, a blue chrominance component, and Cr-data, that is, a red chrominance component. The Y-data includes a 16-bit gradation level, and the 0o-data and the Cr-data includes an 8-bit gradation level. One pixel includes 32-bit information.

In the third embodiment, 8 pieces of Y-data (Y0 to Y7) are assigned to continuing column addresses CA (00 to 03). Eight (8) pairs of Cb-data and Cr-data (Cb0 to Cb7 and Cr0 to Cr7) corresponding to the Y-data are assigned to continuing column addresses CA (04 to 07). A pixel PX that includes RGB elements may be represented by the Y-data, the Cb-data, and Cr-data, for example, Y5, aD5, and Cr5.

Figure 25:
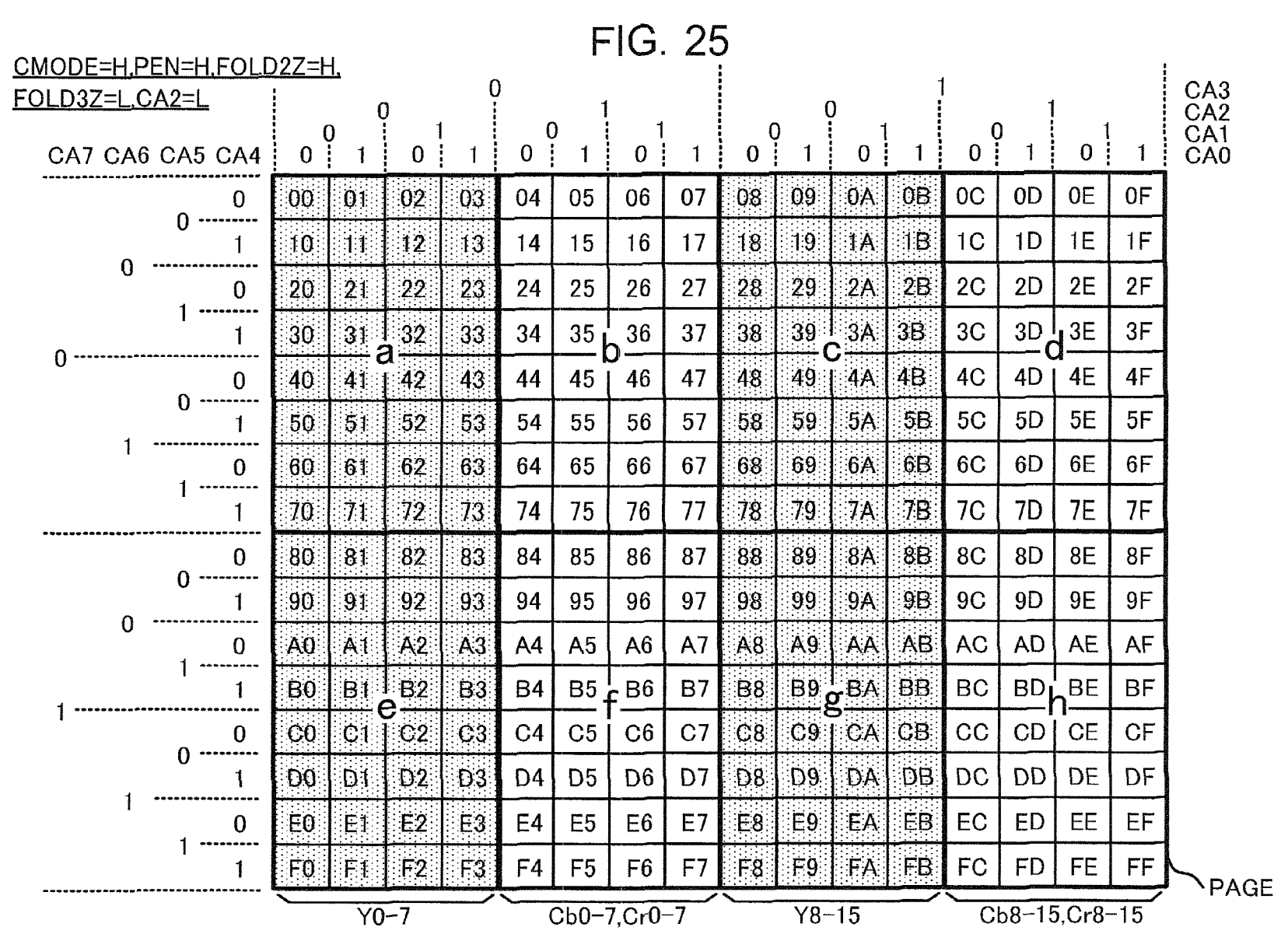

FIG. 25 illustrates an exemplary rectangular access to the memory MEM illustrated in FIG. 19. Horizontal access is the same as or similar to the horizontal access illustrated in FIG. 15. The rectangular access is performed based on an access mode signal CMODE with a high level output by a memory controller MCNT, in response to a rectangular access request RREQ from an image data control unit IMGCNT, such as the image data control unit IMGCNT illustrated in FIG. 2.

In the third embodiment, the mode register 40B outputs a page control enable signal PENZ with a low level, the loopback signal FOLD2Z with the high level, and a loop-back signal FOLD3Z with a low level, in response to values, which are set in advance. The column address signal CA2 is a low level. The area a, the area c, the area e, and the area g (shaded area) that are assigned to the column address signal CA2 with the low level (for example, a value 0) are activated. Among the eight (8) word lines selected by the row address signals RA11 to RA0, the word lines WLa, WLc, WLe, and WLg are activated.

The area a, the area c, the area e, and the area g, each of which corresponds to the column address signal CA2=0, hold the data Y0 to Y7 illustrated in FIG. 24. The minimum memory blocks Rini (are activated when the rectangular control circuit RECTCNT illustrated in FIG. 4 or the other image processing circuits perform process, such as encoding or the like, on the image data by use of the luminance component Y.

Operations when an access mode signal CMODE with a low level and the page control enable signal PENZ with the low level are output are the same as or similar to those illustrated in FIG. 15. Operations when the access mode signal CMODE with the high level, the page control enable signal PENZ with the low level, the loopback signal FOLD2Z with the low level, and the loopback signal FOLD3Z with the high level are output are the same as or similar to those illustrated in FIG. 16. An operation when a page control enable signal PENZ with a high level is output is the same as or similar to that illustrated in FIG. 18.

The third embodiment has the substantially similar advantageous effects as those in the pervious embodiments. In the third embodiment, a power consumption of the memory MEM is brought to minimum when image processing is performed by use of a particular component(s) in the image data.

Figure 26:
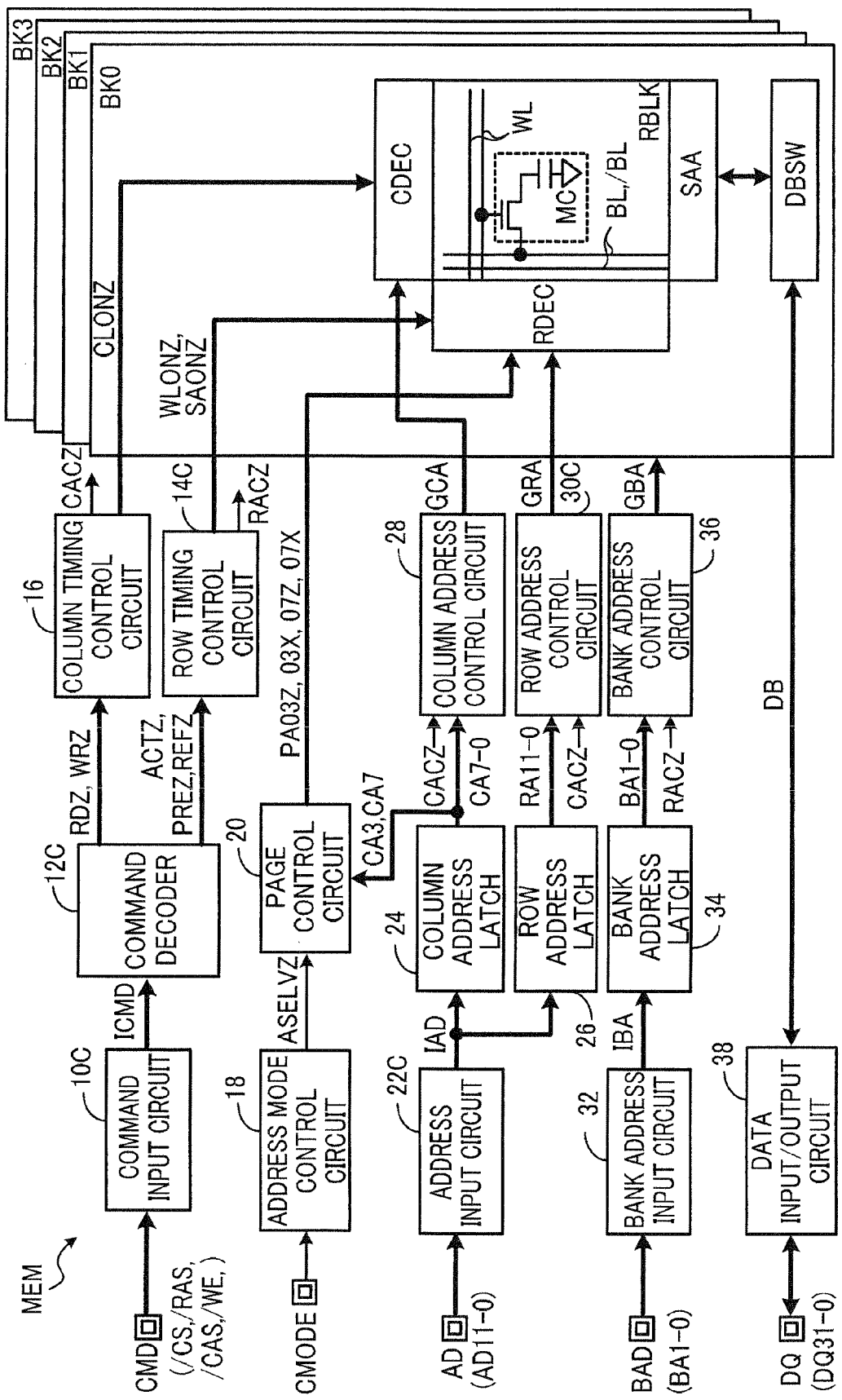
FIG. 26 illustrates an exemplary rectangular access; illustrates a fourth embodiment.

FIG. 26 illustrates a fourth embodiment. For example, a semiconductor memory MEM may be a Dynamic RAM (DRAM). The memory MEM may be a semiconductor memory device housed in a package or a memory macro (IP) provided on a system LSI or the like. The memory MEM according to the fourth embodiment is a clock asynchronous type. Note, however, that the memory MEM may be a clock synchronous type.

The memory MEM includes a command input circuit 10C, a command decoder 12C, a row timing control circuit 14C, an address input circuit 22C, and a row address control circuit 30C, instead of the command input circuit 10, the command decoder 12, the row timing control circuit 14, the address input circuits 22 and 23, and the row address control circuit 30 illustrated in FIG. 1. Other structures of the memory MEM are the same as or similar to those illustrated in FIG. 1. Note that, although it is not shown in FIG. 26, the memory MEM includes, for example, a refresh request generation circuit, which periodically generates an internal refresh request to periodically execute refresh operations during a self refresh mode, and a refresh address counter, which generates a refresh address signal indicating a memory cell to be refreshed.

The command input circuit 10C receives a command signal CMD and outputs the command signal CMD as an internal command signal ICMD. For example, the command signal CMD may includes a chip select signal /CS, a row address strobe signal /RAS, a column address strobe signal /CAS, or a write enable signal /WE.

The command decoder 12C decodes the internal command signal ICMD and outputs an active command signal ACTZ, a read command signal RDZ, a write command signal WRZ, a refresh command signal REFZ, or a pre-charge command signal PREZ so as to access banks BK0 to BK3.

The row timing control circuit 14C activates a word control signal WLONZ and a sense amplifier control signal SAOLTZ to activate each of the banks BR0 to BK3, in response to the active command signal ACTZ, and the refresh command signal REFZ. The row timing control circuit 14C deactivates the word control signal WLONZ and the sense amplifier control signal SAONZ to deactivate each of the banks BK0 to BK3, in response to activation of the pre-charge command signal PREZ. The row timing control circuit 14C does not include a refresh request generation circuit and an arbiter. Other structures of the row timing control circuit 14C are the same as or similar to those of the row timing control circuit 14 illustrated in FIG. 1.

The address input circuit 22C receives a row address signal RAD and a column address signal CAD supplied to an address terminal AD in a time-sharing manner. In one aspect, the row address signal RAD is supplied to address terminals AD11 to AD0 in synchronization with the row address strobe signal /RAS to select a word line WL. The column address signal CAD is supplied to address terminals AD7 to AD0 in synchronization with the column address strobe signal /CAS to select a pair of bit lines BL and /BL.

The row address control circuit 30C latches the row address signals RA11 to RA0, which is not in synchronization with a row address control signal RACE but in synchronization with a column address control signal CACZ, to output as global row address signals GRA (GRA11 to GRA0). Other structures of the row address control circuit 30C are the same as or similar to the row address control circuit 30 illustrated in FIG. 1 except that the row address control circuit 30C does not include a refresh address counter and a address selector. In the fourth embodiment, a row decoder RDEC in each of the banks BK0 to BK3 receives the global row address signal GRA in synchronization with the column address control signal CACZ to start decoding.

An operation of the memory MEN according to the fourth embodiment is the same as or similar to the operations illustrated in FIGS. 14 to 16 except for timing when the row decoder RDEC starts its operation. The fourth embodiment has the substantially similar advantageous effects as those according to the first to third embodiments. In the fourth embodiment, a power consumption of the memory MEM, to which the row address signal RAD and the column address signal CAD are supplied in the time sharing manner, is brought to minimum in response to operation modes based upon types of image processing.

Figure 27:
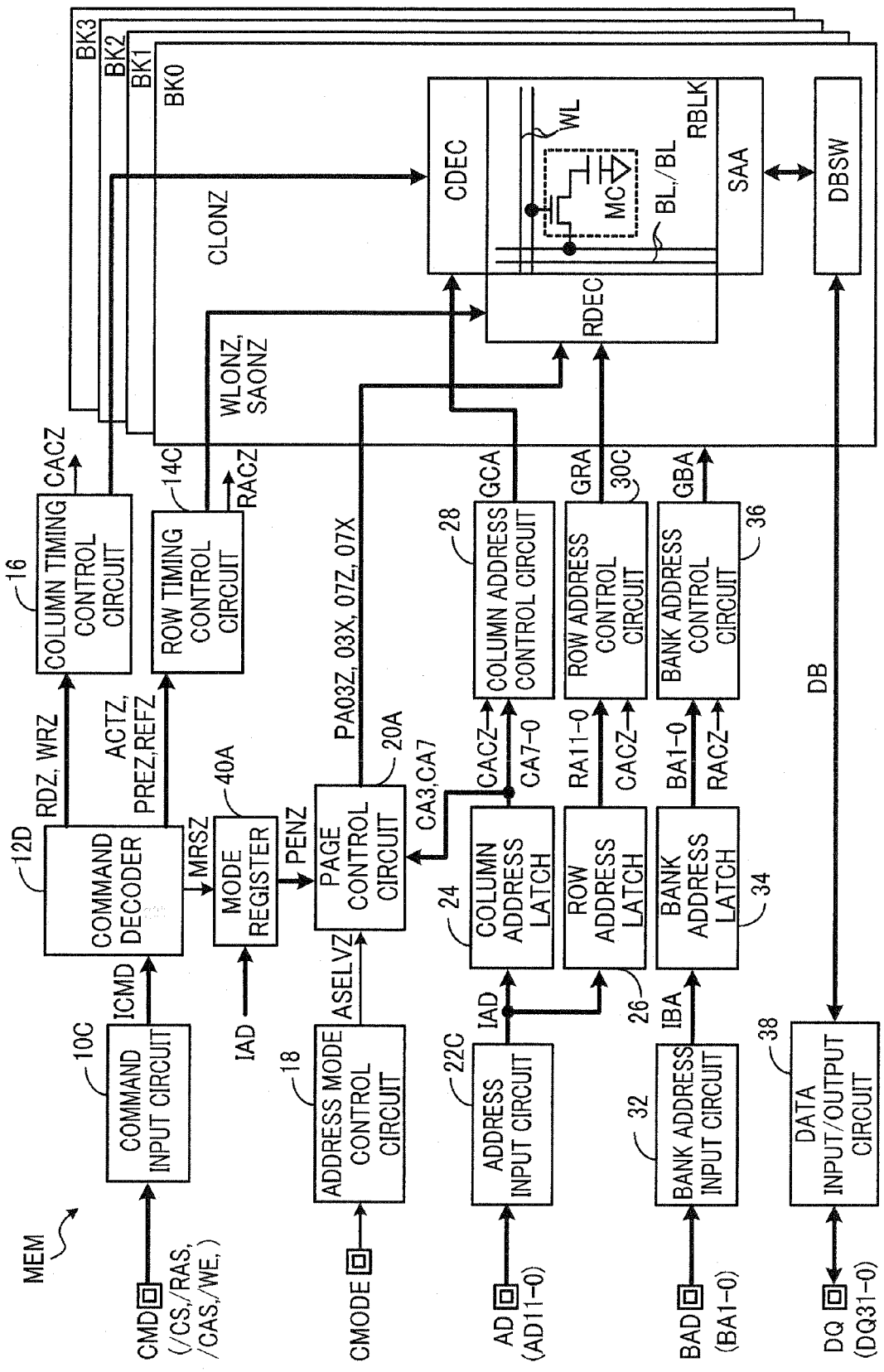
FIG. 27 illustrates a fifth embodiment.

FIG. 27 illustrates a fifth embodiment In the fifth embodiment, the same numerical references and reference symbols are given to the same elements as those shown in the previous embodiments, and detailed descriptions thereof will be reduced or omitted. A memory MEM according to the fifth embodiment includes a command decoder 12D and a page control circuit 20A instead of the command decoder 12C and the page control circuit 20 illustrated in FIG. 26. The memory MEM includes a mode register 40A. Other structures of the memory MEM are the same as or similar to those illustrated in FIG. 26. The semiconductor memory MEM may be a DRAM.

The mode register 40A and the page control circuit 20A are the same as or similar to the mode register and the pace control circuit illustrated in FIG. 17. The command decoder 120 includes the function that the command decoder 12C illustrated in FIG. 26 has and outputs a mode register setting command signal MRSZ to set the mode register 40A. A. generation sequence of the mode register setting command signal MRSZ is the same as or similar to a generation sequence by the command decoder 12A illustrated in FIG. 17.

An operation of the memory MEM according to the fifth embodiment is the same as or similar to the operations illustrated in FIGS. 17 and 18 except for timing when the row decoder RDEC starts its operation. The fifth embodiment has the same advantageous effects as those in the first to the fourth embodiments.

Figure 28:
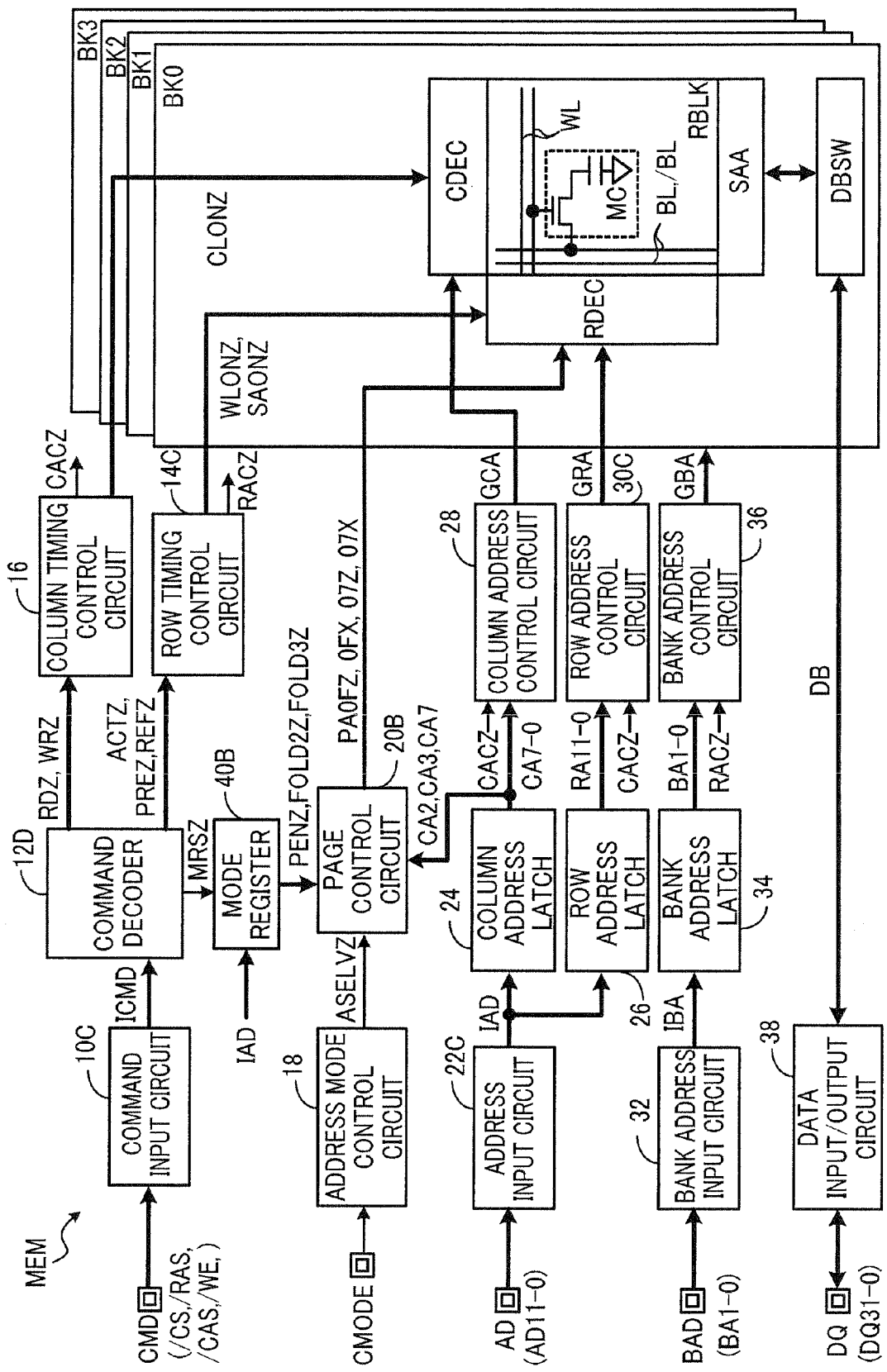
FIG. 28 illustrates a sixth embodiment.

FIG. 28 illustrates a sixth embodiment. In the sixth embodiment, the same numerical references and reference symbols are given to the same elements as those shown in the previous embodiments, and detailed descriptions thereof will be reduced or omitted. A memory MEM according to the sixth embodiment includes a mode register 40B and a page control circuit 203 instead of the mode register 40A and the page control circuit 20A illustrated in FIG. 27. Other structures of the memory MEM are the same as or similar to those illustrated in FIG. 27 except that structures of a row decoder RDEC, a sense amplifier control circuit SCNT, and a memory bock RBLK are different therefrom. The row decoder RDEC, the sense amplifier control circuit SCNT, and the memory block RBLK are the same as or similar to the row decoder, the sense amplifier control circuit, and the memory block illustrated in FIG. 22. The semiconductor memory MEM may be a DRAM.

The mode register 40B and the page control circuit 20B are the same as or similar to the mode register and the page control circuit illustrated in FIG. 19. An operation of the memory MEM according to the sixth embodiment is the same as or similar to the operations illustrated in FIGS. 23 to 25 except for timing when the row decoder RDEC starts its operation. The sixth embodiment has the same advantageous effects as those in the first to the fifth embodiments.

The described embodiments may be applicable to the FCRAM of the pseudo-SRAM type or the DRAM. Note, however, that the first to the sixth embodiments may be applicable to an SRAM, a ferroelectric memory, or the like.

In the first to the sixth embodiments, the sub-memory blocks RBLK, for example, the area a to the area d or the area a to the area h, may be provided by dividing the page PAGE into four (4) parts or into eight (8) parts, and the sub-memory blocks RBLK activated in the page PAGE are specified by a portion of bits of the column address signal CA. Note, however, that, for example, the page PAGE is divided into pieces, the number of which is an n-th power of 2 (n is a positive integer), and the sub-memory block RBLK activated in the page PAGE is specified by n bit{s} of the column address signal CA.

In the semiconductor memory MEM illustrated in FIGS. 17, 19, 27, and 28, the logic level of the page control enable signal PENZ is set by the mode register 40A or 40B. Note, however, that the page control enable signal PENZ may be supplied, for example, to the memory MEM via the external terminal. Additionally, in the semiconductor memory MEM illustrated in FIGS. 19 and 28, the loopback signals FOLD2Z and FOLD3Z may be supplied to the memory MEM via the external terminal.

The semiconductor memory MEM illustrated in FIGS. 1, 17, 26, and 27 holds the image data having the RGB data. Note, however, that the semiconductor memory MEM may hold, for example, image data that includes Y-data, the luminance component, Cb-data, the blue chrominance component, and Cr-data, the red chrominance data.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor memory device comprising:
a memory cell group, the memory cell group including a number of which is 2n, the n being a positive integer;
a first decoder and a second decoder, the first decoder provided with respect to each of the memory cell groups, wherein the first decoder activates a word line by the memory cell group based upon a first address and an n bit in a second address, and the second decoder activates a bit line based upon the second address; and
a page control circuit which supplies the first decoder with a control signal for activating the word line, based upon an external control signal and the n bit in the second address.

2. The semiconductor memory device according to claim 1, wherein the external control signal is a signal related to image processing of an image data held in the memory cell group.

3. The semiconductor memory device according to claim 1, further comprising:
a judgment circuit which judges, based upon an external control signal, whether the word line is activated by at least one memory cell group selected based upon the first address and the n bit in the second address or by a plurality of memory cell groups selected based upon the first address.

4. A semiconductor memory device which activates a word line by a division unit, the semiconductor memory device
wherein the word line is activated by an adjacent division unit in a first word line access mode; and
wherein the word line is activated by a non-adjacent division unit in a second word line access mode.

5. The semiconductor memory device according to claim 4, wherein the first word line access mode and the second word line access mode are each an operation mode related to image processing of an image data held in a memory cell group.

6. The semiconductor memory device according to claim 4, wherein the first word line access mode is an operation mode for displaying an image data; and the second word line access mode is an operation mode for at least one of encoding and decoding the image data.

7. The semiconductor memory device according to claim 4, wherein a first address for activating the word line and a second address for activating a bit line are contemporaneously supplied to the semiconductor memory device.

8. An image processing system comprising:
a memory;
a display data control unit which controls displaying of image data; and
an image data control unit which controls at least one of encoding and decoding of the image data, wherein the memory activates a word line by a given division unit based upon one of a first control signal and a second control signal, the first control signal instructing the display data control unit to access the memory cell, the second control signal instructing the image data control unit to access the memory.

9. The image processing system according to claim 8, wherein the memory activates the word line by adjacent division unit based upon the first control signal and activates the word line by non-adjacent division unit based upon the second control signal.

10. The image processing system according to claim 8, wherein the memory further comprising: a memory cell group, the memory cell group including a number of which is 2n, the n being a positive integer; and a first decoder and a second decoder, the first decoder provided with respect to each of the memory cell groups, wherein the first decoder activates the word line by the memory cell group based upon a first address and the n bit in a second address and the second decoder activates a bit line based upon the second address.

11. The image processing system according to claim 8, wherein all of the divided word lines are activated when one of the first control signal and the second control signal is deactivated.

12. The image processing system according to claim 8, further comprising: a memory controller which receives one of the first control signal and the second control signal and outputs an access mode signal for activating the word line by a given division unit to the memory.

13. The image processing system according to claim 8, further comprising: a memory controller which supplies the display data control unit and the image data control unit with data read from the memory.

14. The image processing system according to claim 8, wherein the memory further comprises: a first decoder which selects the word line based upon a first address and a part of a second address; a second decoder which selects a bit line based upon the second address.

15. An image processing method comprising:
receiving a first memory access request signal for displaying an image data and a second memory access request signal for performing one of encoding and decoding of the image data;
activating a part of a word line divided in plurality based upon one of the first memory access request signal and the second memory access request signal; and
processing the image data read from a memory cell coupled to the activated word line.

16. The image processing method according to claim 15, wherein selecting a combination of an odd-number division part and an even-number division part of the one word line divided into an n number of pieces, based upon the first memory access request signal, the n being a positive integer; and selecting one of a combination of the odd-number division parts and a combination of the even-number division parts of the one word line divided into the n number of pieces, based upon the second memory access request signal, the n being a positive integer.

17. The image processing method according to claim 15, further comprising: receiving a first address for accessing the word line and a second address for accessing a bit line; and activating a part of the word line divided in plurality, based upon the first address and a part of the second address.

18. The image processing method according to claim 15 further comprising activating all of the divided word lines when each of the first memory access request signal and the second memory access request signal are deactivated.

19. A semiconductor memory device comprising:
a memory cell group, the memory cell group including a number of which is 2n, the n being a positive integer;

a first decoder, provided with respect to each of the memory cell groups, which activates a word line by the memory cell group based upon a first address and an n bit in a second address;

a second decoder which activates a bit line based upon the second address; and a judgment circuit which judges, based upon an external control signal, whether the word line is activated by at least one memory cell group selected based upon the first address and the n bit in the second address or by a plurality of memory cell groups selected based upon the first address.

* * * * *